(12) United States Patent
Ahmed et al.

(10) Patent No.: US 11,829,072 B2
(45) Date of Patent: Nov. 28, 2023

(54) DISPLAY DEVICE HAVING INTEGRATED METAMATERIAL LENS

(71) Applicant: Intel Corporation, Santa Clara, CA (US)

(72) Inventors: Khaled Ahmed, Anaheim, CA (US); Richmond Hicks, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 552 days.

(21) Appl. No.: 17/071,811

(22) Filed: Oct. 15, 2020

(65) Prior Publication Data

US 2021/0026248 A1 Jan. 28, 2021

Related U.S. Application Data

(60) Division of application No. 16/555,121, filed on Aug. 29, 2019, now Pat. No. 10,809,623, which is a
(Continued)

(51) Int. Cl.
| | |
|---|---|
| *H01L 23/00* | (2006.01) |
| *G03F 7/00* | (2006.01) |
| *G06T 11/00* | (2006.01) |
| *G02B 1/00* | (2006.01) |
| *H01L 33/58* | (2010.01) |
| *G02B 27/01* | (2006.01) |
| *H01L 25/075* | (2006.01) |
| *C23C 16/40* | (2006.01) |
| *C23C 16/30* | (2006.01) |

(Continued)

(52) U.S. Cl.
CPC ............... *G03F 7/70* (2013.01); *G02B 1/002* (2013.01); *G02B 27/0172* (2013.01); *G06T 11/00* (2013.01); *H01L 25/0753* (2013.01); *H01L 33/58* (2013.01); *B82Y 20/00* (2013.01); *C23C 14/34* (2013.01); *C23C 16/301* (2013.01); *C23C 16/405* (2013.01); *C23C 16/45536* (2013.01); *C23C 16/45555* (2013.01); *C23C 16/50* (2013.01); *G02B 2027/0174* (2013.01); *G02B 2207/101* (2013.01); *H10K 50/858* (2023.02); *Y10S 977/773* (2013.01)

(58) Field of Classification Search
CPC ............................ H01L 25/0753; H01L 33/58
See application file for complete search history.

(56) References Cited

U.S. PATENT DOCUMENTS

| | | |
|---|---|---|
| 2014/0008676 A1 | 1/2014 | Wang et al. |
| 2014/0291711 A1 | 10/2014 | Lee |
| (Continued) | | |

OTHER PUBLICATIONS

Non-Final Office Action dated Nov. 16, 2018 for U.S. Appl. No. 15/381,932.
(Continued)

*Primary Examiner* — Anthony Ho
(74) *Attorney, Agent, or Firm* — Essential Patents Group, LLP

(57) ABSTRACT

Embodiments related to emissive display device structures having an emissive display element and a metamaterial lens having a plurality of nanoparticles over an emissive surface of the emissive display element to control the angular distribution of light emitted from the emissive display element, displays having such controlled emissive display device structures, systems incorporating such controlled emissive display device structures, and methods for fabricating them are discussed.

20 Claims, 10 Drawing Sheets

Related U.S. Application Data continuation of application No. 15/381,932, filed on Dec. 16, 2016, now Pat. No. 10,416,565.

(51) Int. Cl.
    *C23C 16/455*     (2006.01)
    *C23C 16/50*     (2006.01)
    *C23C 14/34*     (2006.01)
    *B82Y 20/00*     (2011.01)
    *H10K 50/858*     (2023.01)

(56) References Cited

U.S. PATENT DOCUMENTS

| | | |
|---|---|---|
| 2016/0087018 A1 | 3/2016 | Shim et al. |
| 2017/0316487 A1 | 11/2017 | Mazed |
| 2018/0129116 A1 | 5/2018 | Akselrod et al. |

OTHER PUBLICATIONS

Non-Final Office Action dated Feb. 21, 2010 for U.S. Appl. No. 16/555,151.

Notice of Allowance dated May 23, 2019 for U.S. Appl. No. 15/381,932.

Notice of Allowance dated Jun. 17, 2020 for U.S. Appl. No. 16/555,121.

Restriction Requirement dated Jun. 1, 2018 for U.S. Appl. No. 15/381,932.

Arbabi, A. et al., "Efficient dielectric metasurface collimating lenses for mid-infrared quantum cascade lasers", Optics Express, vol. 23, No. 26, Dec. 28, 2015.

DISPLAY DEVICE HAVING INTEGRATED METAMATERIAL LENS

CLAIM OF PRIORITY

This Application is a divisional of, and claims priority to, U.S. patent application Ser. No. 16/555,121, filed Aug. 29, 2019, which is a continuation of, and claims priority to, U.S. patent application Ser. No. 15/381,932, filed Dec. 16, 2016, now issued as U.S. Pat. No. 10,416,565 on Sep. 17, 2019, and titled "Display Device Having Integrated Metamaterial Lens", which are incorporated by reference in their entireties for all purposes.

BACKGROUND

Augmented reality device technology, including augmented reality headsets and the like, is an area of emerging interest. For such devices, it may be desirable to have a display device that provides red-green-blue (RGB) colors (e.g., full color) in a compact package with high brightness, collimated light, high contrast, low power, and low manufacturing costs to provide high quality products for users.

As such, there is a continual demand for improved display devices for implementation by augmented reality devices or other devices or systems. It is with respect to these and other considerations that the present improvements have been needed. Such improvements may become critical as the desire to provide high quality micro display devices in a variety of devices such as augmented reality devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
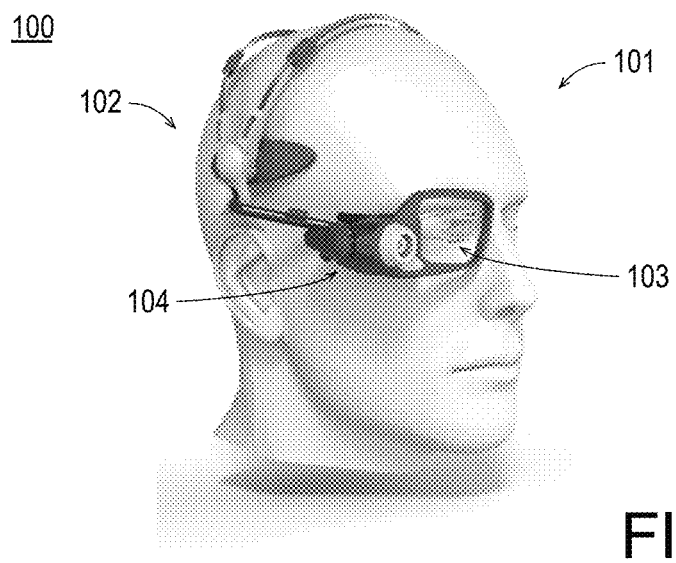
FIG. 1 is an example setting for providing an example augmented reality device.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Display devices, apparatuses, systems, computing platforms, and methods are described below related to display devices having integrated metamaterial lenses.

In some embodiments discussed herein, an emissive display device includes an emissive display element (e.g., a light emitting diode, an organic light emitting diode, a vertical-cavity surface-emitting laser, etc.) having an emissive surface. For example, the emissive surface may be any surface either integrated with the emissive display element or adjacent with respect to the emissive display element such that, in operation, a band of light is emitted through the emissive surface from the emissive display element. As used herein, the term emissive surface may be a surface through which a band of light is emitted during operation from the emissive display element, but the surface need not be in operation to be described or labeled as an emissive surface. A metamaterial lens is provided over the emissive surface of the emissive display element such that the metamaterial lens includes a plurality of nanoparticles to control the angular emission of emitted light, and, in some examples, collimate light from the emissive display element. In some embodiments, the metamaterial lens is on the emissive surface. In other embodiments, the metamaterial lens is on a material, layer, film, or surface adjacent to the emissive surface. The nanoparticles of the metamaterial lens may include any suitable characteristics to control the angular profile of light emitted from the emissive display element. For example, the characteristics (shape, size, placement, pitch, etc.) of the nanoparticles may be selected control the angular emission of or to collimate the particular wavelength band emitted from the emissive display element. Such characteristics are discussed further herein. Furthermore, the nanoparticles discussed herein may be characterized as nano-antennas, nano-blocks, atoms, nano-atoms, or the like.

In another embodiment, an augmented reality device may include an emissive display device as discussed herein, augmented reality optics optically coupled to the emissive display device, and an integrated system coupled to the emissive display device and configured to provide image data to the emissive display device. For example, augmented reality optics may include a visual layer having a prism, a waveguide and first and second holographic beam splitters disposed on opposite ends of the waveguide, or the like. Such an augmented reality device may be provided in any suitable form factor device such as a headset, smart glasses, or the like. In other embodiments, a display device may include an emissive display device as discussed herein. Such a display device may be provided in any suitable form factor device such as a watch, a virtual reality device, a headset, a mobile device such as a smartphone, a phablet, a tablet, a laptop, or the like or as a discrete display device or the like.

FIG. 1 is an example setting 100 for providing an example augmented reality device 102, arranged in accordance with at least some implementations of the present disclosure. As shown in FIG. 1, setting 100 may include a user 101 interacting with augmented reality device 102. For example, augmented reality device 102 may be worn by user 101 and, during operation, user 101 may view a virtual image 103. As used herein the term virtual image refers to an image that is overlaid with respect to setting 100. As is discussed further herein with respect to system 200 below, augmented reality device 102 may include an integrated system (e.g., processor, memory, etc.) to provide image data to a micro-display with an integrated metamaterial lens. The image from the micro-display may be provided to a waveguide having holographic beam splitters on opposite ends thereof to display virtual image 103 to user 101 (e.g., over an eye of user 101). For example, the integrated system and micro-display with integrated metamaterial lens may be provided within package 104. Package 104 may be provided as a component of augmented reality device 102 such that augmented reality device 102 provides virtual image 103 to user 101. For example, virtual image 103 may be pertinent to the surroundings viewed by user 101 (e.g., providing directions, weather information, etc.) while not completely obscuring the surroundings. In the illustrated example, augmented reality device 102 is head mounted on user 101. However, augmented reality device 102 may be used by user 101 in any suitable configuration.

Figure 2A:
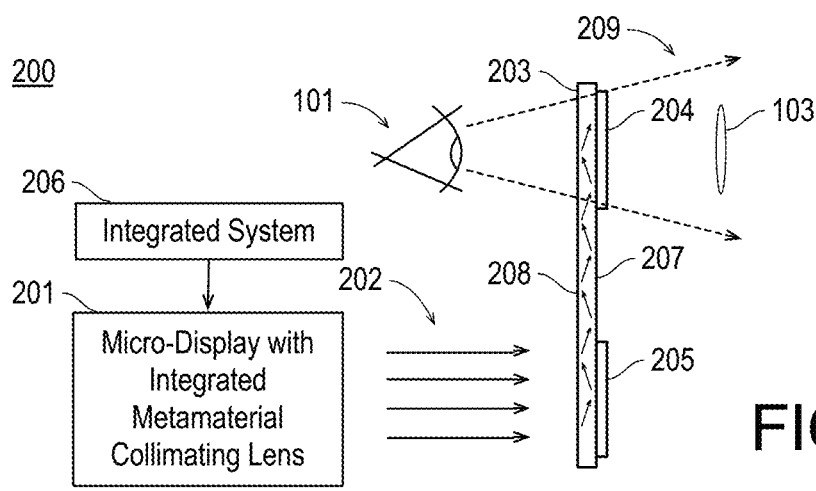
FIG. 2A is an illustrative diagram of an example system for providing a virtual image.

FIG. 2A is an illustrative diagram of an example system 200 for providing virtual image 103, arranged in accordance with at least some implementations of the present disclosure. As shown in FIG. 2A, system 200 may include a micro-display with an integrated metamaterial lens 201, a waveguide 203, a holographic beam splitter 204 and a holographic beam splitter 205 disposed on opposite ends of waveguide 203, and an integrated system 206. For example, micro-display with integrated metamaterial lens 201 may include any emissive display elements and metamaterial lenses discussed herein. In an embodiment, micro-display with integrated metamaterial lens 201 may be characterized as a collimated emissive display device. In an embodiment, micro-display 201 may provide a red-green-blue projected image 202 (e.g., a highly collimated projected image) to waveguide 203 and holographic beam splitter 205 disposed on waveguide 203. For example, micro-display 201 and waveguide 203 may be optically coupled such that projected image may be provided to waveguide. Micro-display 201 and waveguide 203 may be optically coupled using any suitable configuration such as micro-display 201 and waveguide 203 being provided adjacent to one another, micro-display 201 and waveguide 203 being coupled by an optical waveguide (not shown), or the like.

As shown, holographic beam splitter 204 and holographic beam splitter 205 are provided on opposite ends of waveguide 203 and on a shared side 207 of waveguide 203 opposite a side 208 corresponding to the optical coupling to micro-display 201. For example, integrated system 206 may generate virtual image data for display to user 101. Integrated system 206 may generate virtual image data using any suitable technique or techniques. Micro-display 201 may receive the virtual image data and may provide projected image 202. Projected image 202 may enter the end of waveguide 203 having holographic beam splitter 204 via side 208 of waveguide 203 and projected image 202 may be transmitted by waveguide 203 (e.g., via internal reflection of projected image 202 inside the thickness of the glass plate of waveguide) to holographic beam splitter 205 such that virtual image 103 is provided within a field of view 209 of user 101.

In the context of system 200, it may be advantageous for micro-display 201 to provide a highly collimated red-green-blue projected image 202. As is discussed further herein, micro-display 201 may include emissive display elements and metamaterial lenses to control the angular emission of emitted light and/or to provide a highly collimated red-green-blue projected image 202. Such devices and configurations may provide for a small form factor system 200 as a separate, non-integrated, bulky collimating lens may be not be required. Thereby, the devices discussed herein may provide an advantageously small form factor system 200 that may be light weight, more easily packaged into a final device, and the like.

As discussed, FIG. 2A illustrates an augmented reality system implementing a micro-display with an integrated metamaterial lens in the context of a holographic beam splitter embodiment. However, the micro-display with an integrated metamaterial lens may be implemented in any suitable augmented reality system or the like.

Figure 2B:
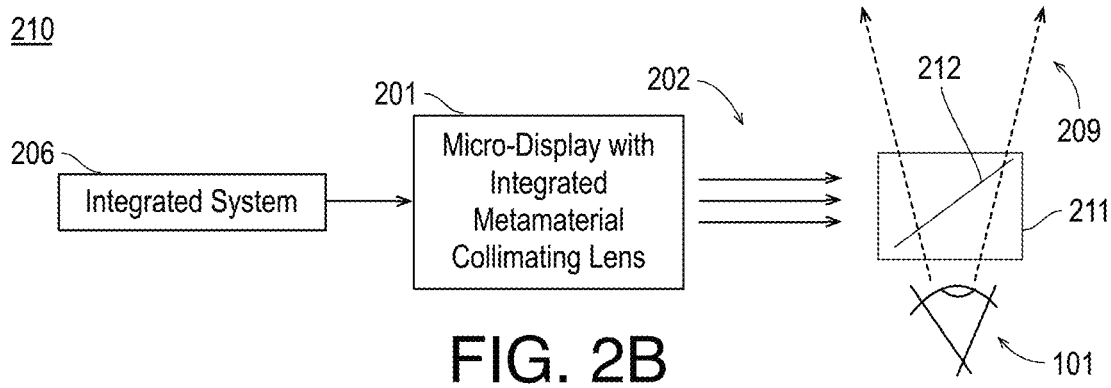
FIG. 2B is an illustrative diagram of another example system for providing a virtual image.

FIG. 2B is an illustrative diagram of an example system 210 for providing a virtual image, arranged in accordance with at least some implementations of the present disclosure. As shown in FIG. 2B, system 210 may include micro-display with an integrated metamaterial lens 201, a visual layer 211 having a prism 212, and integrated system 206. For example, micro-display with integrated metamaterial lens 201 may include any emissive display elements and metamaterial lenses discussed herein. In an embodiment, micro-display with integrated metamaterial lens 201 may be characterized as a collimated emissive display device. In an embodiment, micro-display 201 may provide highly collimated red-green-blue projected image 202 to visual layer 211 and prism 212 such that prism 212 projects a corresponding image to user 101.

Visual layer 211 and prism 212 may include any suitable materials in any suitable configuration. For example, visual layer 211 and prism 212 may be provided optically coupled to micro-display 201 to provide a virtual image to user 101. For example, integrated system 206 may generate virtual image data for display to user 101. Micro-display 201 may receive the virtual image data and may provide projected image 202. Projected image 202 may enter visual layer 211 and prism 212 may project the image to user 101. Furthermore, user 101 may view field of view 209 through visual layer and prism 212 such that the projected image provides an augmented reality with respect to field of view 209.

In the context of system 210, it may be advantageous for micro-display 201 to provide a red-green-blue projected image 202 (e.g., a highly collimated projected image). As is discussed further herein, micro-display 201 may include emissive display elements and metamaterial lenses to control the angular emission of emitted light and/or provide a highly collimated red-green-blue projected image 202. Such devices and configurations may provide for a small form factor system 210 as a separate, non-integrated, bulky collimating lens may be not be required. Thereby, the devices discussed herein may provide an advantageously small form factor system 210 that may be light weight, more easily packaged into a final device, and the like.

Figure 3:
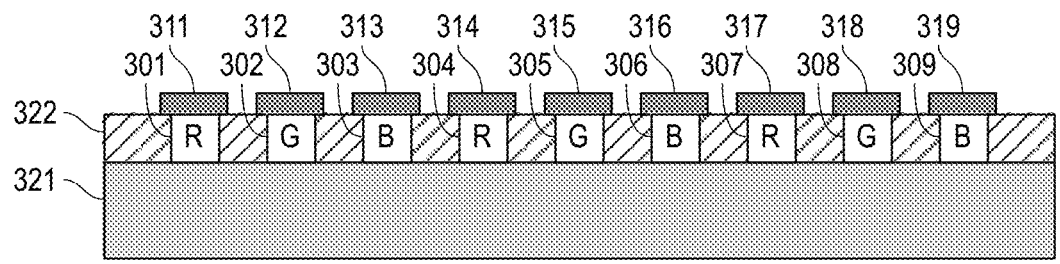
FIG. 3 is a cross-sectional view of an example emissive display device structure.

FIG. 3 is a cross-sectional view of an example emissive display device structure 300, arranged in accordance with at least some implementations of the present disclosure. As shown, emissive display device structure 300 may include a substrate 321, an isolation layer 322, emissive display elements 301, 302, 303, 304, 305, 306, 307, 308, 309 and corresponding metamaterial lenses 311, 312, 313, 314, 315, 316, 317, 318, 319 over emissive display elements 301, 302, 303, 304, 305, 306, 307, 308, 309, respectively. Metamaterial lenses 311-319 may control the angular emission of emitted light from emissive display elements 301-309. Metamaterial lenses 311-319 may be characterized as photonic metamaterial lenses, collimating lenses, metasurface collimating lenses, or the like. Metamaterial lenses 311-319 may include any nanoparticles as discussed further herein below.

As shown, emissive display elements 301-309 may include red (R) emissive display elements 301, 304, 307, green (G) emissive display elements 302, 305, 308, and blue (B) emissive display elements 303, 306, 309 arrayed over substrate 321. From a top-down perspective, emissive display elements 301-309 and corresponding metamaterial lenses 311-319 may be arrayed over substrate 321 in a grid pattern or the like to provide a high pixel density emissive display device. Furthermore, from a top-down perspective emissive display elements 301-309 may be about one to 10 microns wide by about one to 10 microns long although any suitable sixe of emissive display elements 301-309 may be used.

Substrate 321 may include any suitable material, materials, or devices. For example, substrate 321 may be a wafer or carrier or the like such that substrate 321 is a silicon wafer, a sapphire wafer, a gallium arsenide wafer, a gallium nitride wafer, a silicon carbide wafer, or the like. In other examples, particularly in the context of implementation, substrate 321 may be a back plane of a display device including a driver circuit or circuitry, a driver circuit, or the like. For example, substrate 321 may include a driver circuit provided on a back plane, a thin film transistor device structure, or the like. As used herein, the term substrate may indicate any layer or layers adjacent to emissive display elements 301-309. For example, the substrate may include a carrier, a buffer or nucleation layer, isolation or dielectric layers, driver circuitry, back planes, support structures, packaging structures, or the like. Furthermore, isolation layer 322 may include any suitable material or materials for electrically isolating emissive display elements 301-309 such as insulator materials (e.g., silicon dioxide, silicon nitride, aluminum oxide, doped silicon oxide, etc.) or the like. In some embodiments, isolation layer 322 is a transparent dielectric material.

Emissive display elements 301-309 may include any type or combination of types of emissive display elements such as, for example, light emitting diodes, micro light emitting diodes, organic light emitting diodes, vertical-cavity surface-emitting lasers, or the like. In an embodiment, emissive display elements 301-309 are all of the same type (e.g., light emitting diodes, micro light emitting diodes, organic light emitting diodes, a vertical-cavity surface-emitting lasers, etc.) and provide the same color band of light. In an embodiment, emissive display elements 301-309 are all of the same type but provide different color bands of light (e.g., red, green, blue). In an embodiment, emissive display elements 301-309 include different types of emissive devices. For example, one or more bands of light may be provided by a different type of emissive devices.

Metamaterial lenses 311-319, as discussed, may include nanoparticles to control the angular emission of emitted light from emissive display elements 301-309. In an embodiment, metamaterial lenses 311-319 collimate light from emissive display elements 301-309. Metamaterial lenses 311-319 may be characterized as 2D metamaterial lenses, for example. The nanoparticles of metamaterial lenses 311-319 may be any suitable material or materials that may alter the light emitted from emissive display elements 301-309 such as, for example, one or more of silicon, titanium oxide, gallium phosphide, diamond, or the like. Furthermore, as illustrated in detail herein below, the nanoparticles of metamaterial lenses 311-319 may have any suitable cross-sectional shape or shapes such as, for example, a circle, an oval, a square, a rectangle, a cross, a boomerang shape, or the like.

As discussed, groups of emissive display elements 301-309 may provide different bands of colors of light such as emissive display elements 301, 304, 307 providing a red (R) band, emissive display elements 302, 305, 308 providing a red (R) band, and emissive display elements 303, 306, 309 providing a blue (R) band, or the like. In such examples, corresponding metamaterial lenses 311-319 may have different characteristics based on the corresponding band of light of the corresponding emissive display elements 301-309. For example, the nanoparticles of each of metamaterial lenses 311, 314, 317, metamaterial lenses 312, 315, 318, and metamaterial lenses 313, 316, 319 may have different characteristics (e.g., shape, size, placement, pitch, etc.) selected based on the band of light of the corresponding emissive display elements 301-309 to control the angular emission of emitted light. In an embodiment, the nanoparticles may be selected to provide highly collimated light for the particular band of light.

The difference or differing characteristic(s) of the nanoparticles between groups of metamaterial lenses (e.g., between lenses 311, 314, 317, lenses 312, 315, 318, and lenses 313, 316, 319) may include, for example, the cross-sectional shape of the nanoparticles, the size of each nanoparticle or the average sizes of the nanoparticles, the spacing or pitch of the nanoparticles or the average spacing or pitch of the nanoparticles, or the like.

In an embodiment, the nanoparticles of metamaterial lenses 311, 314, 317 have a different cross-sectional shape than those of one or both of the nanoparticles of metamaterial lenses 312, 315, 318 and the nanoparticles of metamaterial lenses 313, 316, 319. For example, the cross-sectional shapes of one group may differ from the other two or all three may have different cross-sectional shapes. The difference in cross-sectional shapes may be among all nanoparticles of the respective groups or only a portion of the nanoparticles of the respective lenses. For example, a group of metamaterial lenses may have a single cross-sectional shape type (of the same or differing sizes) or mixed cross-sectional shapes with only a particular cross-sectional shape differing from those of other group(s) of lenses.

In an embodiment, the nanoparticles of metamaterial lenses 311, 314, 317 have an average cross-sectional size different than that of the average cross-sectional size of the nanoparticles of one or both of metamaterial lenses 312, 315, 318 and the nanoparticles of metamaterial lenses 313, 316, 319. The average cross-sectional size may be any suitable measure such as an average area of the nanoparticles, an average length or width of the nanoparticles, or the like. For example, the average cross-sectional size of one group may differ from the other two or all three may have different average cross-sectional sizes.

In an embodiment, the nanoparticles of metamaterial lenses 311, 314, 317 have an average pitch or spacing different than that of the average pitch or spacing of the nanoparticles of one or both of metamaterial lenses 312, 315, 318 and the nanoparticles of metamaterial lenses 313, 316, 319. For example, the average pitch or spacing of one group may differ from the other two or all three may have different average pitches or spacings. The average pitch or spacing may be any suitable measure such as an average of the distances between like features of the nanoparticles, an average of the distances between like features of groups of nanoparticles, an average of the distances between nanoparticles, a coverage density of the nanoparticles (e.g., a ratio of the area covered by the nanoparticles to a total area including the areas covered and uncovered by the nanoparticles), or the like.

As discussed, metamaterial lenses 311-319 are disposed over emissive display elements 301-309 to control the angular emission of emitted light from emissive surfaces of emissive display elements 301-309. Furthermore, may be any type or combination of types of emissive display elements such as light emitting diodes, organic light emitting diodes, vertical-cavity surface-emitting lasers, or the like.

Figure 4:
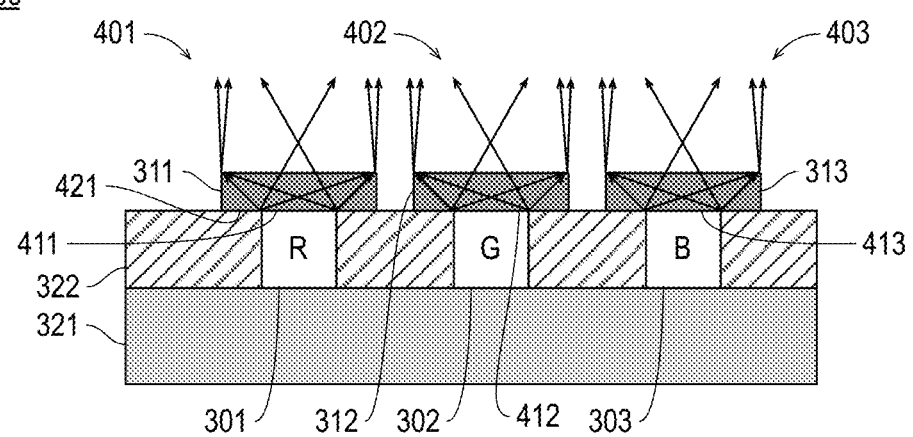
FIG. 4 illustrates an expanded view of example the example emissive display device structure.

FIG. 4 illustrates an expanded view 400 of example emissive display device structure 300, arranged in accordance with at least some implementations of the present disclosure. As shown in FIG. 4, emissive display elements 301 may include an emissive surface 411, emissive display elements 302 may include an emissive surface 412, and emissive display elements 303 may include an emissive surface 413. Emissive display elements 304-309 may include corresponding emissive surfaces. As shown, in an embodiment, emissive surfaces 411, 412, 413 may be a surface of emissive display elements 301, 302, 303 opposite substrate 321. Also as shown, metamaterial lenses 311, 312, 313 may be over emissive surfaces 411, 412, 413 and portions of isolation layer 322 to provide overhangs as illustrated with respect to overhang 421. In other embodiments, metamaterial lenses 311, 312, 313 may be over a portion of one or more of emissive surfaces 411, 412, 413 such that metamaterial lenses 311, 312, 313 do not fully cover emissive surfaces 411, 412, 413.

Also as shown, metamaterial lenses 311, 312, 313 may provide control of the angular emission of light 401, 402, 403, which, as in the illustrated example, may be red light, green light, and blue light, respectively. In an embodiment, metamaterial lenses 311, 312, 313 provide highly collimated red, green and blue light. As shown, in an embodiment, metamaterial lenses 311, 312, 313 may collimate light emitted from emissive display elements 301, 302, 303 that may otherwise disperse in a lambertion wide angle pattern. For example, emissive display elements 301, 302, 303 may have a reduced size as metamaterial lenses 311, 312, 313 more efficiently controls the angular emission of light. Furthermore, such collimation may be achieved without substantial energy loss by metamaterial lenses 311, 312, 313.

As discussed, emissive display elements 301-309 may include any type or types of emissive display elements such as, for example, light emitting diodes, micro light emitting diodes, organic light emitting diodes, a vertical-cavity surface-emitting lasers, or the like. Furthermore, metamaterial lenses 311-319 may be disposed on any structure or emissive surface or the like of emissive display elements 301-309 such as a gallium nitride layer of a micro LED, an aluminum indium gallium phosphide layer of a micro LED, any suitable layer of emissive display elements 301-309 or layer disposed on emissive display elements 301-309.

Figure 5:
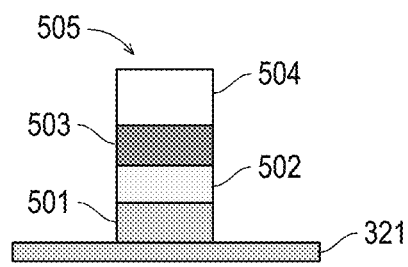
FIG. 5 illustrates an example micro light emitting diode.

FIG. 5 illustrates an example micro light emitting diode 500, arranged in accordance with at least some implementations of the present disclosure. As shown in FIG. 5, micro light emitting diode 500 may include substrate 321, an electron transport layer 501, an active emission layer 502, a hole transport layer 503, and a transparent electrode 504. For example, in the context of micro light emitting diode 500, substrate 321 may include a buffer layer or nucleation layer, electron transport layer 501 may be n-doped gallium nitride, active emission layer 502 may include one or more layers of indium gallium nitride and one or more layers of gallium nitride, hole transport layer 503 may be p-doped gallium nitride, and transparent electrode 504 may be indium tin oxide.

For example, the light emitted by micro light emitting diode 500 may be controlled by the indium concentration in the indium gallium nitride layer(s) of active emission layer 502. For example, an indium concentration of about 41% in the indium gallium nitride layer(s) may provide a red color micro LED, an indium concentration of about 37% in the indium gallium nitride layer(s) may provide a green color micro LED, and an indium concentration of about 20% in the indium gallium nitride layer(s) may provide a blue color micro LED. As shown, micro light emitting diode 500 may include an emissive surface 505 such that light is emitted through at least emissive surface 505 during operation of micro light emitting diode 500.

As discussed, metamaterial lenses 311-319 include nanoparticles that control the angular emission of emitted light emitted from emissive display elements 301-309. For example, metamaterial lenses 311-319 may include nanoparticles having a periodic, cellular structure with subwavelength periodicity that interact with visible light. The metamaterial may be described by an effective medium approximation that, when reacting to an external excitation, are effectively homogeneous with corresponding effective permittivity. The optical properties of such metamaterials (e.g., photonic metamaterials) may arise from an interaction similar to that of atoms or ions in a solid medium. For example, metamaterials may have a negative relative permittivity that may provide for metamaterial lenses 311-319.

As discussed, metamaterial lenses 311-319, which may be characterized as a metasurface lens, may bend light based on the nanoparticles of the metamaterial. For example, metamaterial lenses 311-319 may include a periodic two-dimensional arrangement of nanoparticles having a thickness and periodicity that are small (e.g., 5 to 10 times less than) with respect to the wavelength of light. For example, for visible light, the wavelength may be in the range of about 400 to 700 nanometers. Furthermore, metamaterial lenses 311-319 may have inhomogeneous electromagnetic properties due to the subwavelength details of their structure to control light and provide, for example, collimation. Discussion now turns to example metamaterial lens metasurfaces with example nanoparticles. In the following, the discussed nanoparticles may be any suitable material or materials such as silicon, titanium oxide, gallium phosphide, diamond, or the like.

Figure 6A:
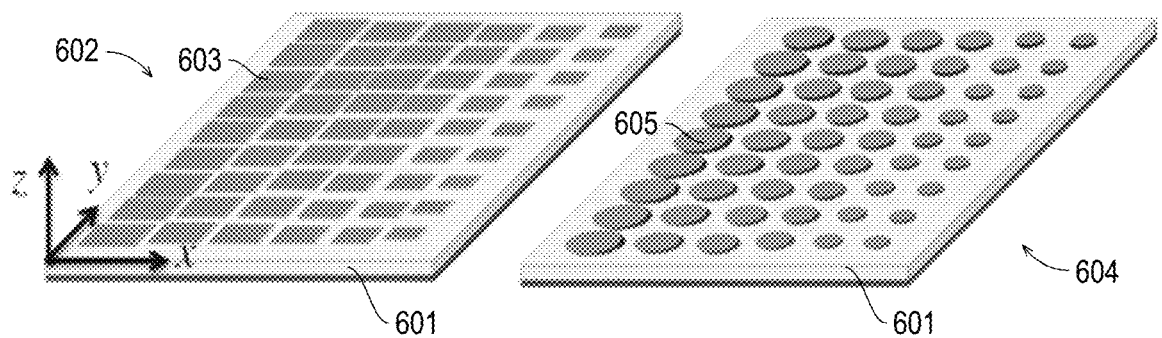
FIGS. 6A, 6B, and 6C illustrate example metamaterial lens metasurfaces.
Figure 6B:
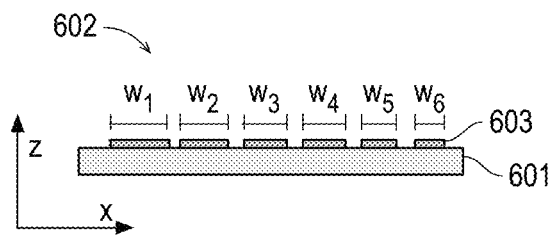
Figure 6C:
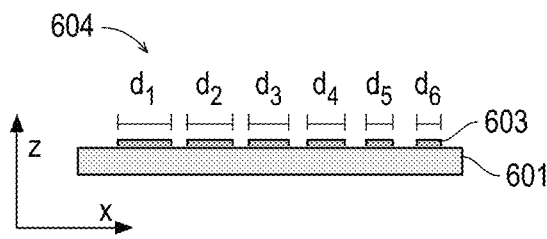

FIGS. 6A, 6B, and 6C illustrate example metamaterial lens metasurfaces, arranged in accordance with at least some implementations of the present disclosure. As shown in FIG. 6A, metamaterial or metasurface 602 includes nanoparticles 603 on a substrate 601 and metamaterial or metasurface 604 includes nanoparticles 605 on a substrate 601. In the context of FIGS. 6A-C, 7, 8, 9, 10, and 11, substrate 601 may be any suitable surface for forming a metamaterial or metasurface such as an emissive surface of an emissive display element, a buffer layer over an emissive display element, or the like. Furthermore, the metamaterials or metasurfaces of nanoparticles discussed with respect to FIGS. 6A-C, 7, 8, 9, 10, and 11 may be implemented in any metamaterial lens discussed herein such as emissive display elements 301, 304, 307, emissive display elements 302, 305, 308, and/or emissive display elements 303, 306, 309 either alone or in combination.

As shown in FIG. 6A, metamaterial 602 includes nanoparticles 603 having a square or rectangular cross-sectional shape (e.g., a three-dimensional cuboid shape). In an embodiment, metamaterial 602 includes nanoparticles having a variety of sizes such that nanoparticles 603 have substantially square or rectangular cross-section and widths (e.g., $w_1$, $w_2$, $w_3$, $w_4$, $w_5$, $w_6$), please refer to FIG. 6B, or lengths (not labeled but extending in the y-direction) that vary across metamaterial 602. Such widths or lengths may be any suitable values and may be based on the wavelength of light for which they are implemented to control the angular emission of emitted light as discussed herein. For example, for a red emissive display element, nanoparticles 603 may have lengths or widths in the range of about 60 to 150 nanometers, for a green emissive display element, nanoparticles 603 may have lengths or widths in the range of about 45 to 120 nanometers, and for a blue emissive display element, nanoparticles 603 may have lengths or widths in the range of about 40 to 120 nanometers. As discussed, in some embodiments, nanoparticles 603 have a square cross-sectional shape and, in other embodiments, nanoparticles 603 have a rectangular cross-sectional shape. Furthermore, in the illustrated embodiment, nanoparticles 603 have varying widths and/or lengths. In an embodiment nanoparticles 603 of metamaterial 602 are all substantially the same size.

Also as shown in FIG. 6A, metamaterial 604 includes nanoparticles 605 having a circular or oval cross-sectional shape (e.g., nanoparticles 605 are cylinders or elliptical cylinders). In an embodiment, metamaterial 604 includes nanoparticles having a variety of sizes such that nanoparticles 605 have substantially circular or oval cross-section and diameters (e.g., $d_1$, $d_2$, $d_3$, $d_4$, $d_5$, $d_6$), please refer to FIG. 6C, or lengths or widths or the like that vary across metamaterial 604. Such diameters or lengths or widths may be any suitable values and may be based on the wavelength of light for which they are implemented to control the angular emission of emitted light as discussed herein. For example, for a red emissive display element, nanoparticles 605 may have diameters or lengths or widths in the range of about 60 to 150 nanometers, for a green emissive display element, nanoparticles 605 may have diameters or lengths or widths in the range of about 45 to 120 nanometers, and for a blue emissive display element, nanoparticles 605 may have diameters or lengths or widths in the range of about 40 to 120 nanometers.

Nanoparticles 603, 605 may have any suitable thickness such as a thickness of about 2 to 10 times less than the wavelength of light for which they are implemented to control the angular emission of emitted light as discussed herein. For example, for a red emissive display element, nanoparticles 603 may have a thickness of about 60 to 400 nanometers, for a green emissive display element, nanoparticles 603 may have a thickness of about 45 to 300 nanometers, and for a blue emissive display element, nanoparticles 603 may have a thickness of about 40 to 270 nanometers. In an embodiment, nanoparticles 603, 605 have a thickness in the range of about 200 to 400 nanometers. In an embodiment, nanoparticles 603, 605 are high aspect ratio nanoparticles having an aspect ratio of a height of the nanoparticle to a width (or length or diameter or the like) of the nanoparticle of at least 2.5.

Figure 7:
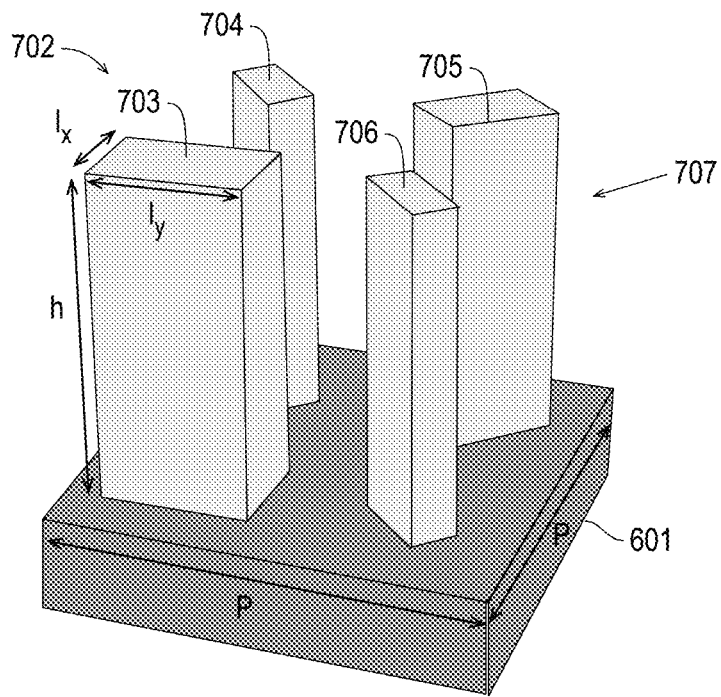
FIG. 7 illustrates an example metamaterial lens metasurface.

FIG. 7 illustrates an example metamaterial lens metasurface 702, arranged in accordance with at least some implementations of the present disclosure. As shown in FIG. 7, metamaterial or metasurface 702 includes nanoparticles 703, 704, 705, 706 on substrate 601. As discussed, metamaterial lens metasurface 702 of nanoparticles 703, 704, 705, 706 may be implemented in any metamaterial lens discussed herein. As shown in FIG. 7, nanoparticles 703, 704, 705, 706 may be rectangular cuboids having the same or varying cross-sectional dimensions and/or varying orientations. Nanoparticles 703, 704, 705, 706 may have any suitable dimensions. As discussed, the dimensions of nanoparticles of metamaterial lenses may be based on the wavelength of light the metamaterial lens is controlling. In an embodiment, nanoparticles 703, 704, 705, 706 may have a height (h) of about the wavelength of light divided by two (i.e., h≈λ/2), a first cross-sectional dimension ($l_x$) of about the wavelength of light divided by seven (i.e., $l_x$≈λ/7), and a second cross-sectional dimension ($l_y$) of about the wavelength of light divided by five (i.e., $l_x$≈λ/5) as illustrated with respect to nanoparticle 703. For example, for a red emissive display element, nanoparticles 703, 704, 705, 706 may have a height (h) in the range of about 300 to 400 nanometers, a first cross-sectional dimension ($l_x$) in the range of about 80 to 100 nanometers, and a second cross-sectional dimension ($l_y$) in the range of about 120 to 150 nanometers. For a green emissive display element, nanoparticles 703, 704, 705, 706 may have a height (h) in the range of about 250 to 300 nanometers, a first cross-sectional dimension ($l_x$) in the range of about 60 to 75 nanometers, and a second cross-sectional dimension ($l_y$) in the range of about 95 to 120 nanometers. For a blue emissive display element, nanoparticles 703, 704, 705, 706 may have a height (h) in the range of about 210 to 260 nanometers, a first cross-sectional dimension ($l_x$) in the range of about 60 to 75 nanometers, and a second cross-sectional dimension ($l_y$) in the range of about 85 to 110 nanometers.

Also as shown, nanoparticles 703, 704, 705, 706 may provide a repeating unit 707 that is repeated across metasurface 702. For example, repeating unit 707 may have a pitch (P) of about the wavelength of light divided by two (i.e., P≈λ/2). For example, for a red emissive display element, the pitch may be in the range of about 300 to 400 nanometers, for a green emissive display element, the pitch may be in the range of about 250 to 300 nanometers, and for a blue emissive display element, the pitch may be in the range of about 210 to 260 nanometers. In some embodiments, nanoparticles 703, 704, 705, 706 may have dimensions as discussed with respect to nanoparticles 603 of metamaterial 602.

Figure 8:
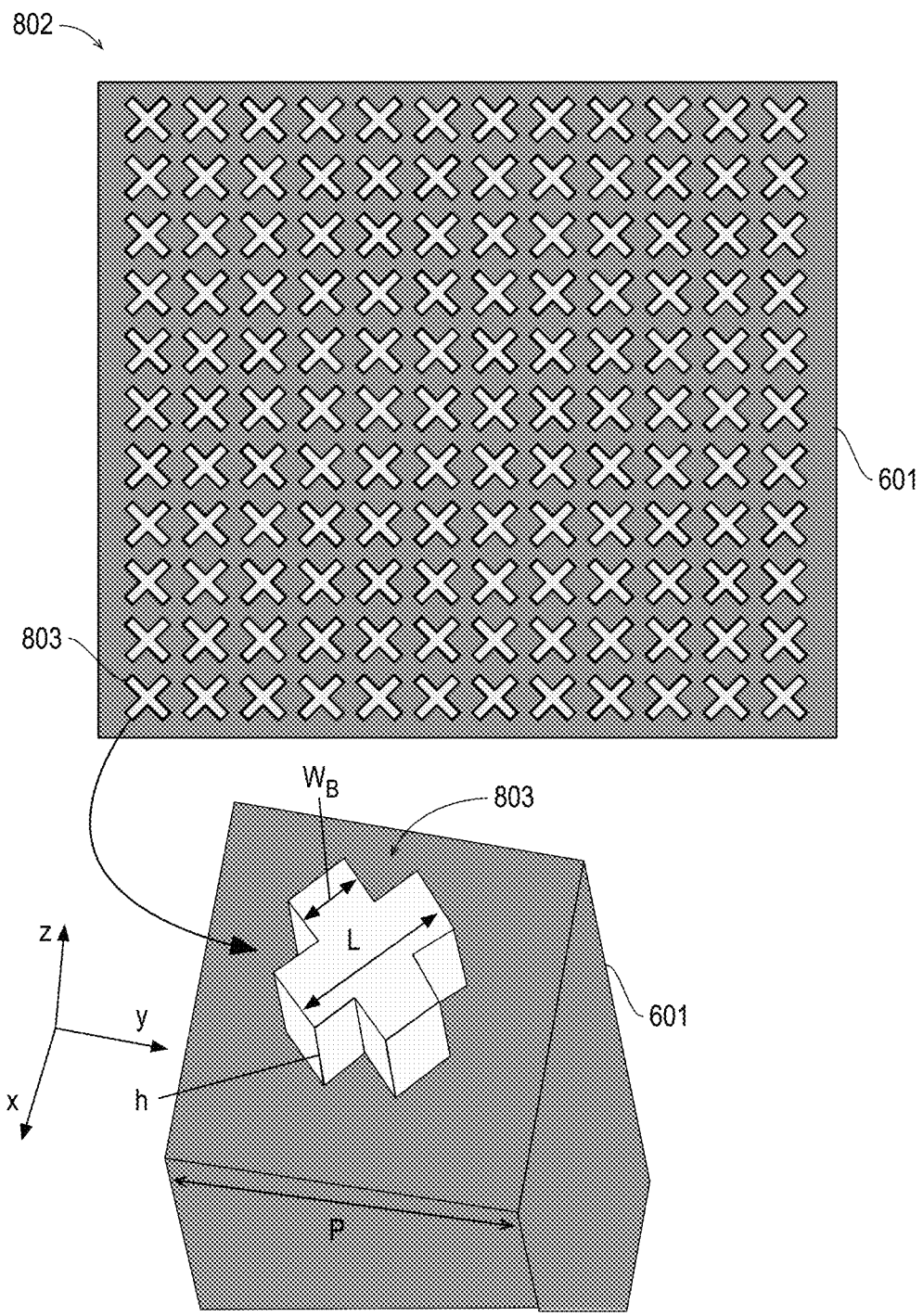
FIG. 8 illustrates an example metamaterial lens metasurface having nanoparticles with x-shaped cross-sections.

FIG. 8 illustrates an example metamaterial lens metasurface 802 having nanoparticles with x-shaped cross-sections, arranged in accordance with at least some implementations of the present disclosure. As shown in FIG. 8, metamaterial or metasurface 802 includes nanoparticles 803 on substrate 601. As discussed, metamaterial lens metasurface 802 of nanoparticles 803 may be implemented in any metamaterial lens discussed herein. As shown in FIG. 8, nanoparticles 803 may have a cross-sectional shape of a cross or an x-shape. For example, nanoparticles 803 may each include two intersecting bars that intersect at approximately their midpoints, are perpendicular, and are approximately the same length. However, in other examples, nanoparticles 803 may have intersecting bars of different lengths, bars that intersect at non-mid points of one or both bars, or bars that are not perpendicular. In an embodiment, nanoparticles 803 are approximately the same size, shape and orientation and are arrayed as a grid. In other embodiments, nanoparticles may have different sizes, shapes, orientations, or varying pitches.

Nanoparticles 803 may have any suitable dimensions. As discussed, the dimensions of nanoparticles of metamaterial lenses may be based on the wavelength of light the metamaterial lens is controlling. In an embodiment, nanoparticles 803 may have a height (h) of about the wavelength of light divided by two (i.e., h≈λ/2), an overall length or bar length (L) of about the wavelength of light divided by about five to 10 (i.e., L≈λ/10-λ/5), and bar width of ($W_B$) that is in the range of about one-fifth to about one-half of the overall bar length (i.e., $W_B$=k*L, k≈0.2-0.5) Also as shown, nanoparticles 803 may be repeated across metasurface 802 at a pitch (P) of about the wavelength of light divided by two (i.e., P≈λ/2).

In an embodiment, metasurface 802 may be provided over an emissive display element that emits a red band and the wavelength may be in the range of about 620-750 nm. In an embodiment, metasurface 802 may be provided over an emissive display element that emits a green band and the wavelength may be in the range of about 495-570 nm. In an embodiment, metasurface 802 may be provided over an emissive display element that emits a blue band and the wavelength may be in the range of about 450-495 nm. For example, for a red emissive display element, nanoparticles 803 may have an overall length in the range of about 60 to 150 nanometers and a pitch and/or height in the range of about 300 to 400 nanometers, for a green emissive display element, nanoparticles 603 may have an overall length in the range of about 45 to 120 nanometers and a pitch and/or height in the range of about 250 to 300 nanometers, and for a blue emissive display element, nanoparticles 603 may have an overall length in the range of about 40 to 120 nanometers and a pitch and/or height in the range of about 200 to 250 nanometers.

Figure 9:
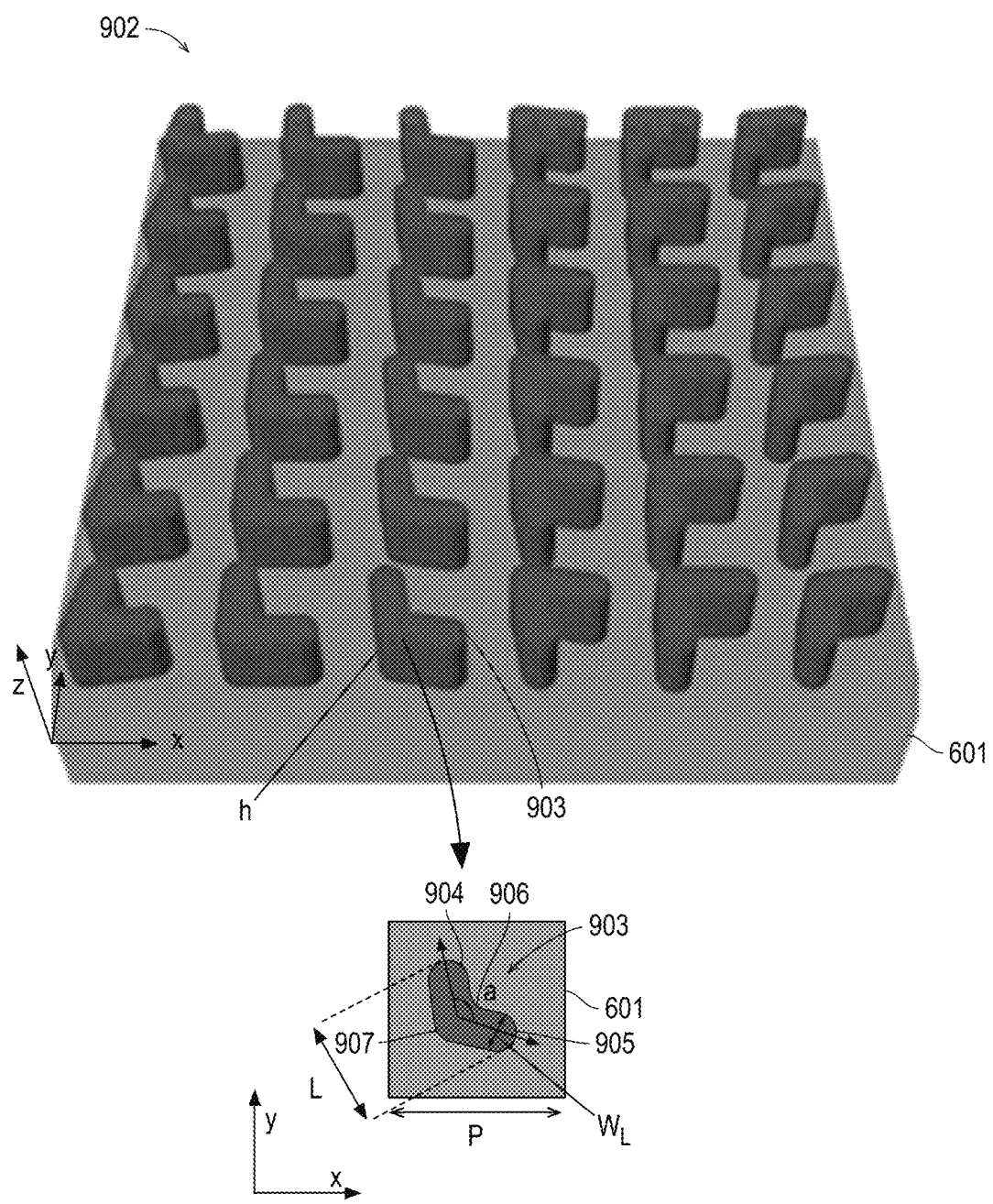
FIG. 9 illustrates an example metamaterial lens metasurface having boomerang cross-sectional shaped nanoparticles.

FIG. 9 illustrates an example metamaterial lens metasurface 902 having boomerang cross-sectional shaped nanoparticles, arranged in accordance with at least some implementations of the present disclosure. As shown in FIG. 9, metamaterial or metasurface 902 includes nanoparticles 903 on substrate 601. As discussed, metamaterial lens metasurface 902 of nanoparticles 903 may be implemented in any metamaterial lens discussed herein. As shown in FIG. 9, nanoparticles 903 may have a cross-sectional shape of a boomerang or a kidney bean shape or the like. For example, nanoparticles 903 may each include two extending legs 904, 905 with rounded ends that are at an angle (a) with respect to the centerlines of extending legs 904, 905. Furthermore, at the intersection of extending legs 904, 905, nanoparticles 903 include a curved interior joint 906 and a curved exterior joint 907. As shown, extending legs 904, 905 may intersect at approximately their midpoints, be approximately the same length, and intersect at an obtuse angle. However, in other examples, nanoparticles 903 may have extending legs 904, 905 of different lengths, extending legs 904, 905 that intersect at non-mid points of one or both of extending legs 904, 905, or extending legs 904, 905 that are at right or acute angles. In an embodiment, nanoparticles 903 are approximately the same size, shape and orientation and are arrayed as a grid. In other embodiments, nanoparticles 903 may have different sizes, shapes, orientations, or varying pitches. For example, as shown in FIG. 9, the angle of intersection of extending legs 904, 905 among nanoparticles 903 may be varied across metasurface 902 such that the angle of intersection is acute in some nanoparticles 903 and right or obtuse in others.

Nanoparticles 903 may have any suitable dimensions. As discussed, the dimensions of nanoparticles of metamaterial lenses may be based on the wavelength of light the metamaterial lens is controlling. In an embodiment, nanoparticles 903 may have a height (h) of about the wavelength of light divided by two (i.e., h≈λ/2), an overall length (L) of about the wavelength of light divided by about five to 10 (i.e., L≈λ/10-λ/5), and leg width of ($W_L$) that is in the range of about one-fifth to about one-half of the overall bar length (i.e., $W_L$=k*L, k≈0.2-0.5) Also as shown, nanoparticles 903 may be repeated across metasurface 902 at a pitch (P) of about the wavelength of light divided by two (i.e., P≈λ/2). As discussed herein, metasurface 902 may be provided over an emissive display element that emits a red band (λ≈620-750 nm), a green band (λ≈495-570 nm), or a blue band (λ≈450-495 nm). For example, for a red emissive display element, nanoparticles 903 may have an overall length in the range of about 60 to 150 nanometers and a pitch and/or height in the range of about 300 to 400 nanometers, for a green emissive display element, nanoparticles 903 may have an overall length in the range of about 45 to 120 nanometers and a pitch and/or height in the range of about 250 to 300 nanometers, and for a blue emissive display element, nanoparticles 903 may have an overall length in the range of about 40 to 120 nanometers and a pitch and/or height in the range of about 200 to 250 nanometers.

Figure 10:
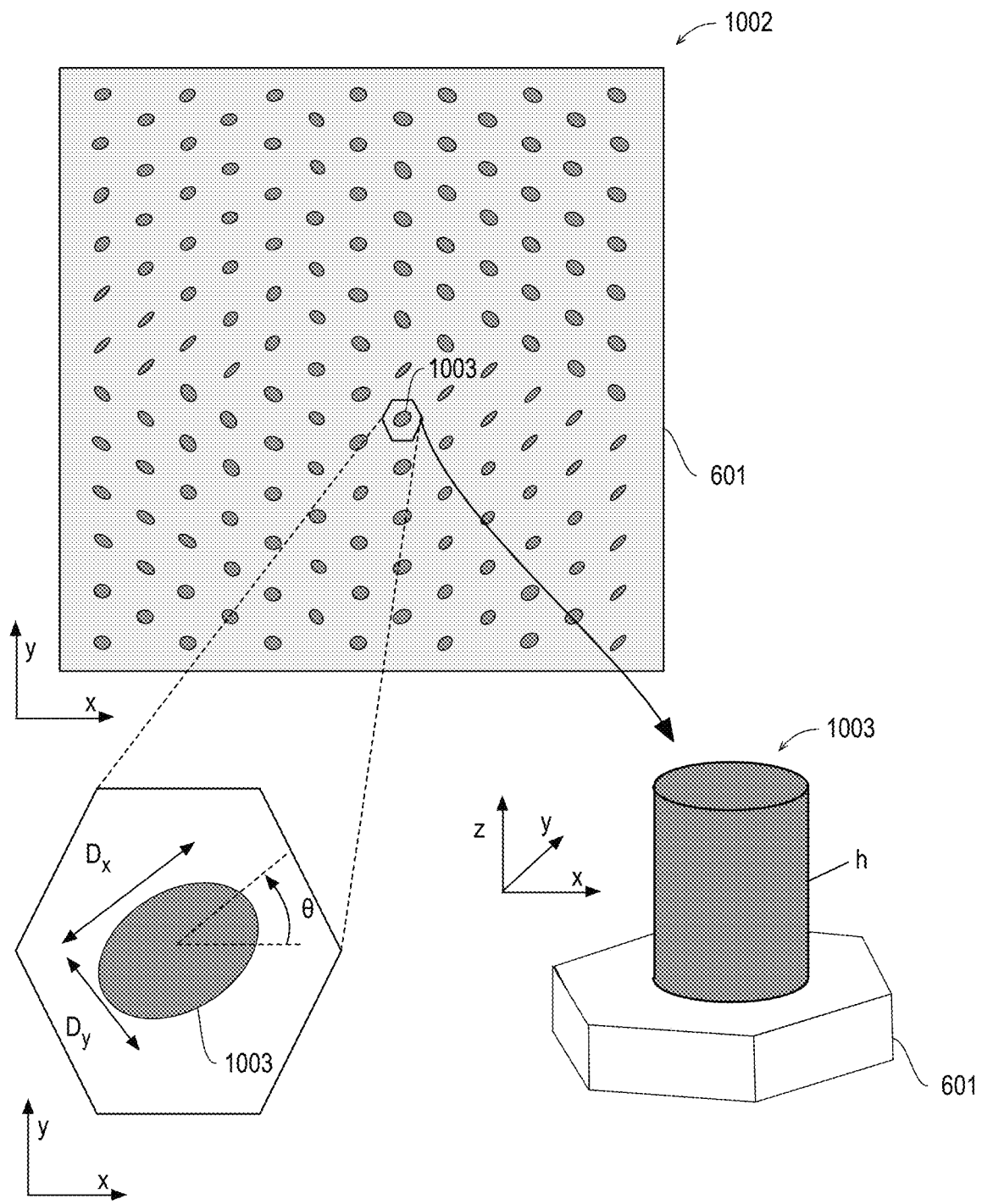
FIG. 10 illustrates an example metamaterial lens metasurface having elliptical cylinder nanoparticles.

FIG. 10 illustrates an example metamaterial lens metasurface 1002 having elliptical cylinder nanoparticles, arranged in accordance with at least some implementations of the present disclosure. As shown in FIG. 10, metamaterial or metasurface 1002 includes nanoparticles 1003 on substrate 601. As discussed, metamaterial lens metasurface 1002 of nanoparticles 1003 may be implemented in any metamaterial lens discussed herein. As shown in FIG. 10, nanoparticles 1003 may be elliptical cylinders (e.g., nanoparticles 1003 are elliptical or oval in cross-section) having the same or varying cross-sectional dimensions and/or varying orientations. Nanoparticles 1003 may have any suitable dimensions. As discussed, the dimensions of nanoparticles of metamaterial lenses may be based on the wavelength of light the metamaterial lens is controlling. In an embodiment, nanoparticles 1003 may have a height (h) of about the wavelength of light divided by two (i.e., h≈λ/2), a first cross-sectional dimension or diameter ($D_x$) of about the wavelength of light divided by seven (i.e., $l_x$≈λ/7), and a second cross-sectional dimension or diameter ($D_y$) of about the wavelength of light divided by five (i.e., $l_x$≈λ/5).

As shown, nanoparticles 1003 may be provided within metamaterial lens metasurface 1002 at varying cross-sectional dimensions and or orientations (as defined by the degree angle, θ, of a long axis of the nanoparticle varies from a particular direction along substrate 601 such as the x-direction as illustrated). For example, in the context of a red band of light nanoparticles 1003 may have a first cross-sectional dimension or diameter ($D_x$) in the range of about 60 to 150 nanometers and a second cross-sectional dimension or diameter ($D_y$) in the range of about 20 to 100 nanometers. In the context of a green band of light nanoparticles 1003 may have a first cross-sectional dimension or diameter ($D_x$) in the range of about 45 to 120 nanometers and a second cross-sectional dimension or diameter ($D_y$) in the range of about 15 to 80 nanometers. In the context of a blue band of light nanoparticles 1003 may have a first cross-sectional dimension or diameter ($D_x$) in the range of about 40 to 120 nanometers and a second cross-sectional dimension or diameter ($D_y$) in the range of about 15 to 50 nanometers.

Figure 11:
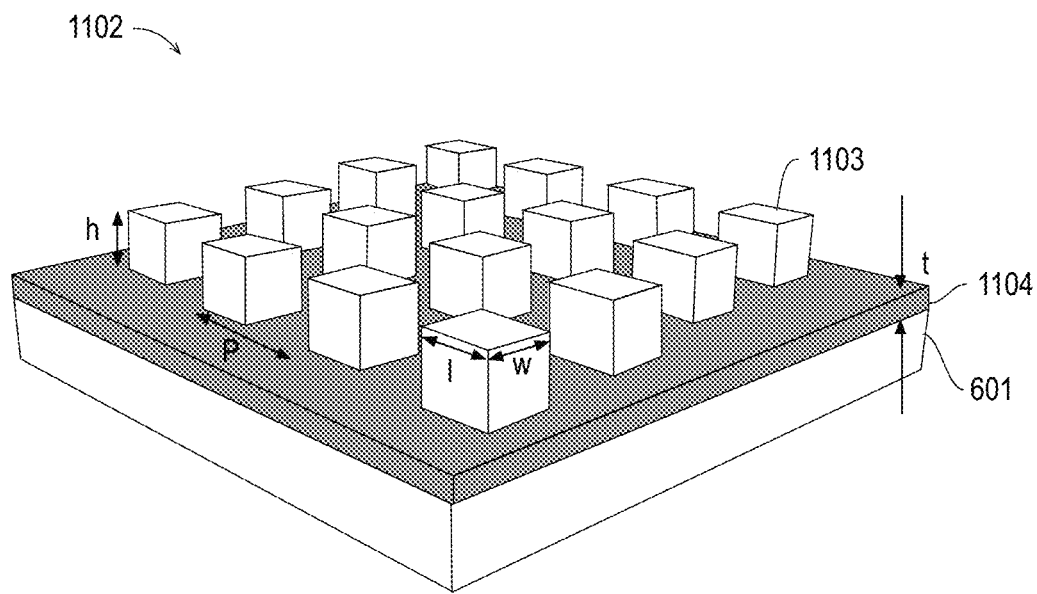
FIG. 11 illustrates an example metamaterial lens metasurface on an example spacer layer.

FIG. 11 illustrates an example metamaterial lens metasurface 1102 on an example spacer layer, arranged in accordance with at least some implementations of the present disclosure. As shown in FIG. 11, metamaterial or metasurface 1102 includes nanoparticles 1103 on a spacer or buffer layer 1104, which is on substrate 601. As discussed, metamaterial lens metasurface 1102 of nanoparticles 1103 may be implemented in any metamaterial lens discussed herein. Furthermore, FIG. 11 illustrates an embodiment in which buffer layer 1104 is disposed on the emissive display element (e.g., any of emissive display elements 301-309). Such embodiments are also discussed further herein with respect to FIGS. 13A-13D.

As shown in FIG. 11, nanoparticles 1103 may be rectangular cuboids or cubes or the like (e.g., nanoparticles 1103 are square or rectangular in cross-section). In the illustrated example, nanoparticles 1103 have substantially the same cross-sectional dimensions, height (h), orientation and are arrayed in a grid pattern over buffer layer 1104. In other examples, nanoparticles may have varying cross-sectional dimensions, orientations, and/or varying orientations. Nanoparticles 11103 may have any suitable dimensions such as those discussed with respect to nanoparticles 603, 703-706. As discussed, the dimensions of nanoparticles of metamaterial lenses may be based on the wavelength of light the metamaterial lens is controlling. In an embodiment, nanoparticles 1103 may have a height (h) of about the wavelength of light divided by two (i.e., h≈λ/2) and cross-sectional length and width (l, w) in the range of about the wavelength of light divided by five to 10 (i.e., l≈w≈λ/10-λ/5).

Also as shown, nanoparticles 1103 may be repeated or arrayed across metasurface 1102 at a pitch (P) of about the wavelength of light divided by two (i.e., P≈λ/2). As discussed herein, metasurface 1102 may be provided over buffer layer 1104, which may be disposed over an emissive display element that emits a red band (λ≈620-750 nm), a green band (λ≈495-570 nm), or a blue band (λ≈450-495 nm). For example, for a red emissive display element, nanoparticles 1103 may have a length and width in the range of about 60 to 150 nanometers and a pitch and/or height in the range of about 300 to 400 nanometers, for a green emissive display element, nanoparticles 1103 may have a length and width in the range of about 45 to 120 nanometers and a pitch and/or height in the range of about 250 to 300 nanometers, and for a blue emissive display element, nanoparticles 1103 may have an overall length in the range of about 40 to 120 nanometers and a pitch and/or height in the range of about 200 to 250 nanometers.

Buffer layer 1104 may include any suitable material or material such as silicon dioxide, silicon nitride, aluminum oxide, doped silicon oxide, or the like. Furthermore, buffer layer 1104 may have any suitable thickness (t) such as a thickness in the range of about 20 to 400 nanometers. Buffer layer 1104 may provide a substantially flat surface for nanoparticles 1103 as well as a predefined surface material for nanoparticles such as nanoparticles 1103. Such a predefined surface may advantageously provide more predictable characteristics for the implementation of metasurfaces discussed herein.

Figure 12:
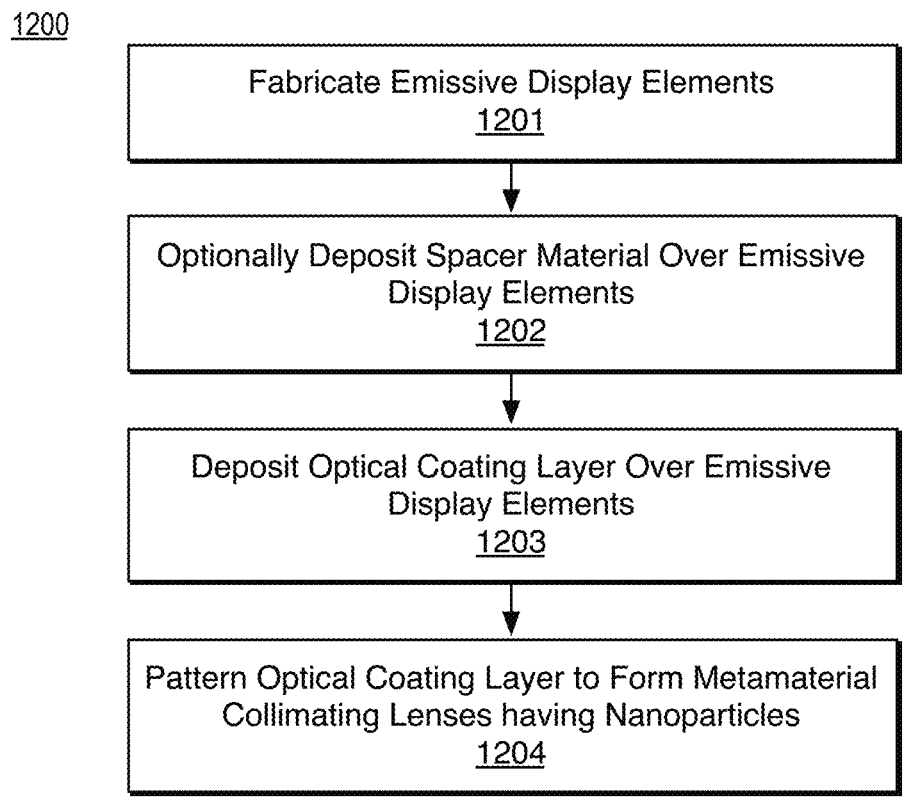
FIG. 12 is a flow diagram illustrating an example process for fabricating an emissive display device.

FIG. 12 is a flow diagram illustrating an example process 1200 for fabricating an emissive display device, arranged in accordance with at least some implementations of the present disclosure. For example, process 1200 may be implemented to fabricate any emissive display device structure discussed herein such as emissive display device structure 300 or emissive display device structure 1304. In the illustrated implementation, process 1200 may include one or more operations as illustrated by operations 1201-1204. However, embodiments herein may include additional operations, certain operations being omitted, or operations being performed out of the order provided.

Process 1200 may begin at operation 1201, where emissive display elements may be fabricated over a substrate. The emissive display elements may be fabricated using any suitable technique or techniques. For example, the emissive display elements may include one or more of light emitting diodes, micro light emitting diodes, organic light emitting diodes, a vertical-cavity surface-emitting lasers, or the like. Furthermore, the emissive display elements may include a combination of red, green, and blue emissive display elements arrayed over a substrate. The substrate may include any suitable substrate such as a wafer or carrier or a back plane of a display device including a driver circuit or circuitry. For example, process 1200 may provide fabrication techniques implemented after emissive display elements are formed on a back plane or driver circuit or the like. In an embodiment, one or more of emissive display elements 301-309 may be disposed fabricated over substrate 321 as discussed herein with respect to FIG. 13A.

Process 1200 may continue at operation 1202, where a spacer or buffer layer may be disposed over emissive surfaces of the emissive display elements. The spacer or buffer layer may include any suitable material or materials substantially transparent to light emitted by the emissive display elements. For example, the spacer or buffer layer may be any or a combination of silicon dioxide, silicon nitride, aluminum oxide, doped silicon oxide, or the like. Furthermore, the spacer or buffer layer may be disposed over the emissive surfaces of the emissive display elements using any suitable technique or techniques at any suitable thickness such as a thickness in the range of 50 to 400 nanometers. In an embodiment, the a spacer or buffer layer is disposed by a low temperature deposition at a temperature no greater than 400° C. Such low temperature processing may be advantageous in that it does not disturb previously fabricated emissive display elements. The spacer or buffer layer may provide a substantially flat surface for subsequent fabrication of metamaterial lenses as well as a controlled material interface (e.g., the spacer or buffer may be selected whereas the emissive surface may not be selectable) for the metamaterial lenses. In an embodiment, a spacer or buffer layer may be disposed over emissive surfaces of the emissive display elements as discussed herein with respect to FIG. 13B. In other embodiments, no spacer or buffer layer may be applied as discussed herein.

Process 1200 may continue at operation 1203, where an optical coating layer may be disposed over the emissive surfaces of the emissive display elements. The optical coating layer may include any suitable material or materials such as one or more of silicon, titanium oxide, gallium phosphide, diamond. The optical coating layer provided at operation 1203 does not have the properties of metamaterials as discussed herein (e.g., such properties may be provided at operation 1204). The term optical coating layer as used herein refers to a layer, film, or the like of a material that may provide, after patterning, a metamaterial lens as discussed herein. The optical coating layer may be formed using any suitable technique or techniques such as atomic layer deposition, plasma enhanced atomic layer deposition, chemical vapor deposition, plasma enhanced chemical vapor deposition, physical sputtering deposition, or the like. In an embodiment, disposing the optical coating layer is performed by a low temperature deposition at a temperature no greater than 400° C. Such low temperature processing may be advantageous in that it does not disturb previously fabricated emissive display elements. In some examples, the optical coating layer is disposed on the spacer or buffer layer discussed with respect to operation 1202. In other examples, the optical coating layer is disposed on the emissive surfaces of the emissive display elements as illustrated with respect to FIG. 3 and elsewhere herein. In an embodiment, an optical coating layer may be disposed over the emissive surfaces of the emissive display elements as discussed herein with respect to FIG. 13C.

Process 1200 may continue at operation 1204, where the optical coating layer may be patterned to form metamaterial lenses having nanoparticles as discussed herein. The optical coating layer may be patterned using any suitable technique or techniques such as deep ultraviolet lithography, extreme ultraviolet lithography, nanoimprint lithography, electron beam lithography, or the like. The metamaterial lenses formed at operation may include any metamaterial lenses and any nanoparticles discussed herein. In an embodiment, the emissive display elements fabricated at operation 1201 include an emissive display element to emit a red band of light, an emissive display element to emit a green band of light, and an emissive display elements to emit a blue band of light. In such an embodiment, the optical coating layer disposed at operation 1203 may be disposed over emissive surfaces of the emissive display elements and patterning the optical coating layer may include forming corresponding metamaterial lenses over the red, green, and blue emissive display elements such that the nanoparticles of the metamaterial lens over the red emissive display elements have an average cross-sectional size that is greater than the average cross-sectional size of the nanoparticles of the metamaterial lens over the green emissive display elements, which is greater than the average cross-sectional size of the nanoparticles of the metamaterial lens over the blue emissive display elements. Such nanoparticles may have the same cross-sectional shapes or they may be different. In an embodiment, the optical coating layer may be patterned to form metamaterial lenses having nanoparticles as discussed herein with respect to FIG. 13C.

Process 1200 may be utilized to generate any emissive display device structure as discussed herein such as those discussed with respect to emissive display device structure 300 or emissive display device structure 1304 or the like.

Figure 13A:
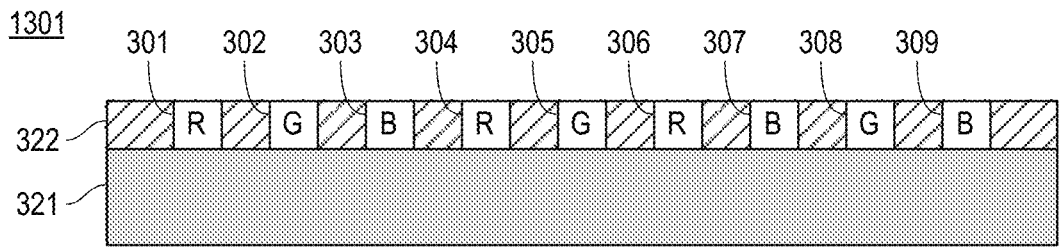
FIGS. 13A, 13B, 13C, and 13D are cross-sectional views of example emissive display device structures as particular fabrication operations are performed.

FIGS. 13A, 13B, 13C, and 13D are cross-sectional views of example emissive display device structures as particular fabrication operations are performed, arranged in accordance with at least some implementations of the present disclosure. As shown in FIG. 13A, an emissive display device structure 1301 includes substrate 321, isolation layer 322, and emissive display elements 301-309 fabricated over substrate 321. Emissive display elements 301-309 may be fabricated over substrate 321 using any suitable technique or techniques. Emissive display elements 301-309 may include any combination of light emitting diodes, micro light emitting diodes, organic light emitting diodes, a vertical-cavity surface-emitting lasers, or the like as discussed herein and emissive display elements 301-309 may include a combination of red, green, and blue emissive display elements arrayed over substrate 321. Substrate 321 may include any suitable substrate such as a wafer or carrier or a back plane of a display device including a driver circuit or circuitry. Also as shown, isolation layer 322 may be provided on substrate 321 and adjacent to emissive display elements 301-309. Isolation layer 322 may be formed using any suitable technique or techniques either before or after the fabrication of emissive display elements 301-309. In an embodiment, isolation layer 322 may be provided having trenches therein and emissive display elements 301-309 may be formed in the trenches.

Figure 13B:
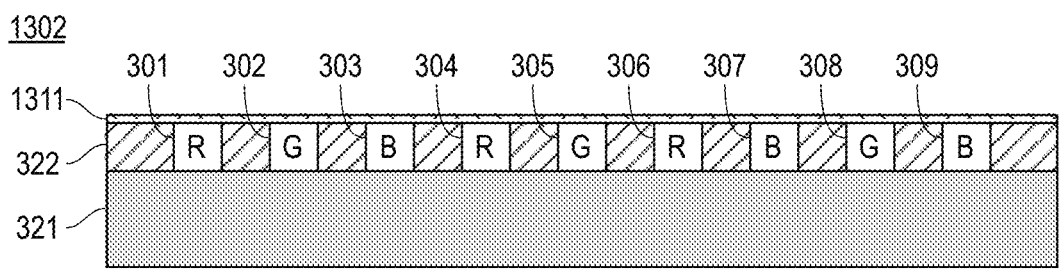

FIG. 13B illustrates an emissive display device structure 1302 similar to emissive display device structure 1301, after the formation of buffer layer 1311. Buffer layer 1311 may include any suitable material or materials such as silicon dioxide, silicon nitride, aluminum oxide, doped silicon oxide, or the like. Buffer layer 1311 may be disposed on emissive display elements 301-309 and exposed portions of isolation layer 322 using any suitable technique or techniques such as atomic layer deposition, plasma enhanced atomic layer deposition, chemical vapor deposition, plasma enhanced chemical vapor deposition, physical sputtering deposition. In an embodiment, forming buffer layer 1311 includes a low temperature deposition at a temperature no greater than 400° C. Buffer layer 1311 may have any suitable thickness such as a thickness in the range of about 50 to 400 nanometers. Buffer layer 1311 may provide a substantially flat surface for subsequent fabrication of metamaterial lenses as well as a controlled material interface for the metamaterial lenses.

Figure 13C:
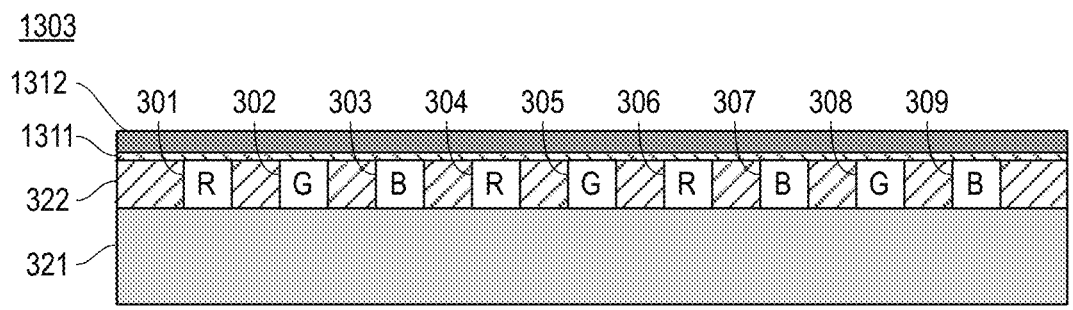

FIG. 13C illustrates an emissive display device structure 1303 similar to emissive display device structure 1302, after the formation of optical coating layer 1312. Optical coating layer 1312 may include any suitable material or materials and any suitable thickness for the formation of metamaterial lenses. For example, optical coating layer 1312 may include one or more of silicon, titanium oxide, gallium phosphide, or diamond having a thickness in the range of about 150 to 450 nanometers. Optical coating layer 1312 may be disposed on buffer layer 1311 (or on emissive display elements 301-309 and exposed portions of isolation layer 322 when buffer layer 1311 is not used) using any suitable technique or techniques such as atomic layer deposition, plasma enhanced atomic layer deposition, chemical vapor deposition, plasma enhanced chemical vapor deposition, physical sputtering deposition. In an embodiment, forming optical coating layer 1312 includes a low temperature deposition at a temperature no greater than 400° C. As discussed, the material(s) and thickness of the nanoparticles of metamaterial lenses may be a factor in the performance of the metamaterial lenses. In the context of FIGS. 13A-13D, the material(s) and thickness of the nanoparticles of different metamaterial lenses are shared as optical coating layer 1312 is formed uniformly over emissive display elements 301-309. Therefore, the differing properties among metamaterial lens properties (e.g., to collimate different wavelengths of light) may be provided by the size, shape, and pitch of the nanoparticles among the respective metamaterial lenses.

Figure 13D:
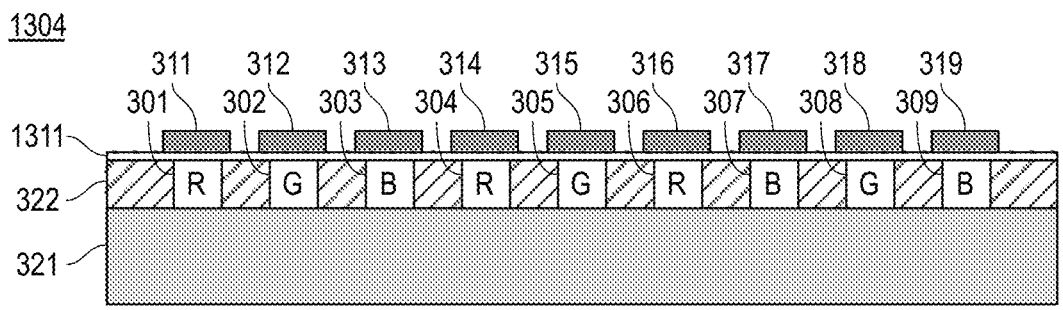

FIG. 13D illustrates an emissive display device structure 1304 similar to emissive display device structure 1303, after the patterning of optical coating layer 1312 to form metamaterial lenses 311-319. Metamaterial lenses 311-319 may be patterned from optical coating layer 1312 using any suitable technique or techniques such as such as deep ultraviolet lithography, extreme ultraviolet lithography, nanoimprint lithography, electron beam lithography, or the like. As shown, the patterning may provide spacing or gaps between adjacent metamaterial lenses 311-319. Furthermore, as discussed, each of metamaterial lenses 311-319 may include nanoparticles such as those discussed herein to control the angular emission of emitted light from emissive display elements 301-309 during operation. The nanoparticles of metamaterial lenses 311-319 may include any nanoparticles discussed herein. For example, the nanoparticles of metamaterial lenses 311-319 may have a cross-sectional shape include any or combinations of a circle, an oval, a square, a rectangle, a cross, or a boomerang shape. Furthermore, the nanoparticles of metamaterial lenses 311-319 may have any suitable sizes discussed herein.

As discussed, metamaterial lenses 311, 314, 317 (red band lenses), metamaterial lenses 312, 315, 318 (green band lenses), and metamaterial lenses 313, 316, 319 (blue band lenses) may have different features such that the lenses may selectively control the angular emission of emitted light of the respective bands of light. In an embodiment, all three types of lenses may have different characteristics. In an embodiment, two types of lenses may have the same characteristics and the third lens type may be different. For example, the lenses may differ in the type(s) of cross-sectional shapes of nanoparticles, the sizes of nanoparticles, the orientations of nanoparticles, or the pitch of the nanoparticles. In an embodiment, the average size of nanoparticles for metamaterial lenses 311, 314, 317 (red band lenses) is greater than the average size of nanoparticles for metamaterial lenses 312, 315, 318 (green band lenses), which is greater than the average size of nanoparticles for metamaterial lenses 313, 316, 319 (blue band lenses). In addition or in the alternative, the average pitch of nanoparticles for metamaterial lenses 311, 314, 317 (red band lenses) is greater than the average pitch of nanoparticles for metamaterial lenses 312, 315, 318 (green band lenses), which is greater than the average pitch of nanoparticles for metamaterial lenses 313, 316, 319 (blue band lenses).

The devices, systems, and fabrication techniques discussed herein provide emissive display devices that control the angular emission of emitted light. For example, the emissive display devices may provide collimated emissive display devices that have low power consumption, high pixel density, full RGB color output, and highly collimated light output. Furthermore, the emissive display devices with integrated metamaterial lenses described herein may be utilized in display devices of any type or form factor for any form factor devices. For example, a system may include an emissive display device having an emissive display element and a metamaterial lens over at least a portion of an emissive surface of the emissive display element such that the metamaterial lens includes a plurality of nanoparticles, a waveguide optically coupled to the emissive display device, and first and second holographic beam splitters disposed on opposite ends of the waveguide as discussed herein with respect to FIGS. 1 and 2. In an embodiment, a system may include a memory coupled to a processor, a wireless transceiver, and a display device including any emissive display devices with integrated metamaterial lenses described herein. For example, the system may be a mobile computing platform or device such as a watch, a smartphone, a tablet, or a laptop, an augmented reality device, a virtual reality device, a headset, or a typically stationary device such as a television, a monitor, a desktop computer, or the like.

Figure 14:
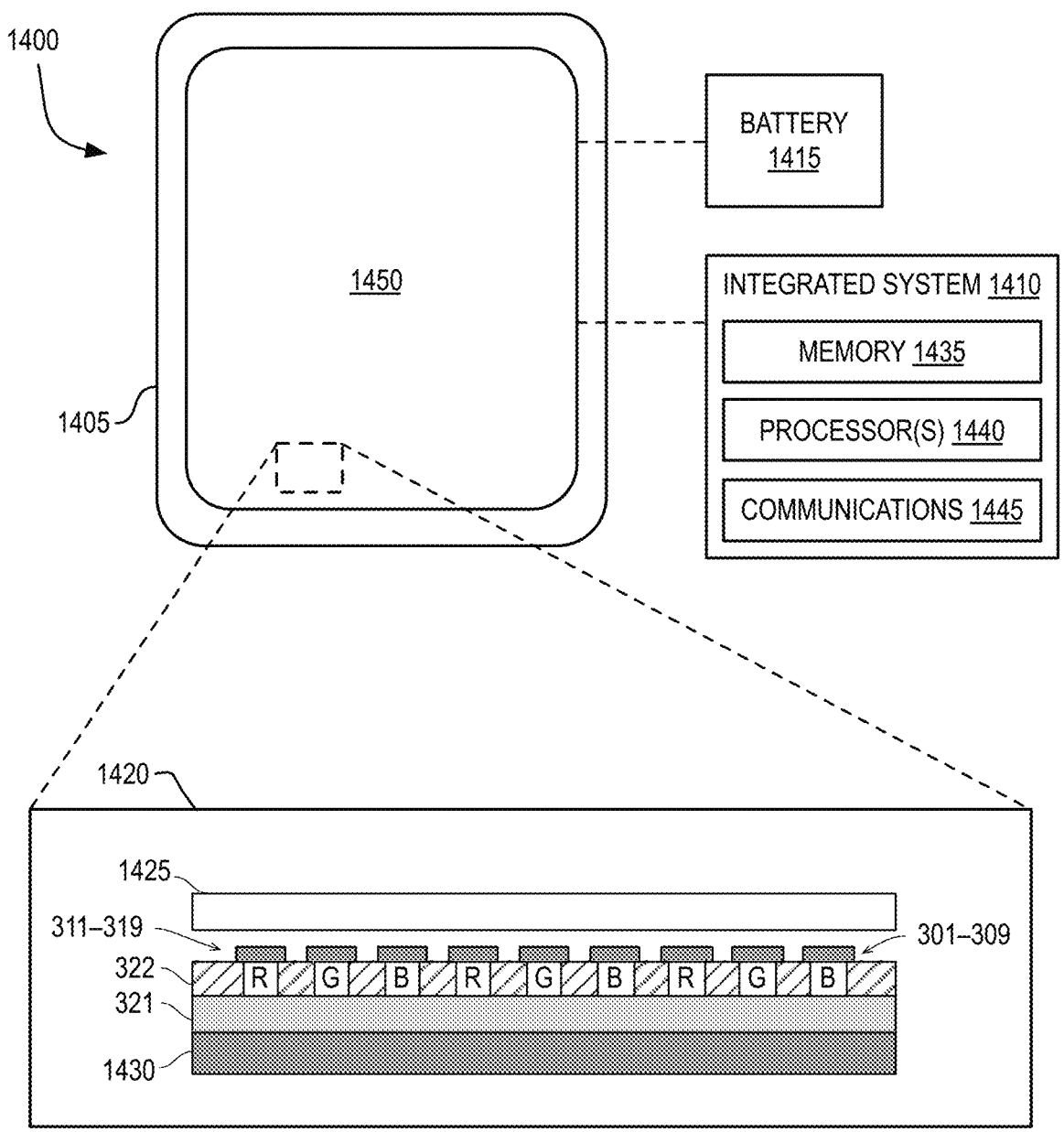
FIG. 14 illustrates a system in which a mobile computing platform employs an emissive display device structure.

FIG. 14 illustrates a system 1400 in which a mobile computing platform 1405 employs an emissive display device structure, arranged in accordance with at least some implementations of the present disclosure. Mobile computing platform 1405 may be any portable device configured for each of electronic data display, electronic data processing, wireless electronic data transmission, or the like. For example, although illustrated as a tablet, mobile computing platform 1405 may be any of a tablet, a smartphone, a phablet, a laptop computer, a watch, an augmented reality device, a virtual reality device, a headset etc., and may include a display device 1450 employing an emissive display device structure such as emissive display device structure 300 as illustrated in expanded view 1420.

Also as illustrated in expanded view 1420, display device 1450 may include a glass front plate 1425 and a back plane or plate 1430. For example, glass front plate 1425 may be disposed adjacent to metamaterial lenses 311-319 and may provide protection for components of emissive display device structure 300 and a monolithic display structure for a viewer of display device 1450. Back plane 1430 may similarly provide a monolithic structure for implementing and/or housing emissive display device structure 300 and/or other components of display device 1450. In an embodiment, a driver circuit is implemented via backplane 1430. Furthermore, glass front plate 1425 and/or back plane 1430 may provide components of and/or be provided within a housing of system 1400.

Although illustrated with respect to emissive display device structure 300, any suitable emissive display device structure, such as emissive display device structure 1304, may be implemented in display device 1450. Furthermore, display device 1450 may provide touch capability via a capacitive, inductive, resistive, or optical touchscreen. Also as shown, mobile computing platform 1405 includes a chip-level or package-level integrated system 1410 and a battery 1415. Although illustrated with respect to mobile computing platform 1405, the emissive display device structures discussed herein may also be employed via a display of a desktop computer, television, or the like.

Integrated system 1410 may be implemented as discrete components (e.g., integrated circuits) or as a system on a chip and may include may include memory circuitry 1435 (e.g., random access memory, storage, etc.), processor circuitry 1440 (e.g., a microprocessor, a multi-core microprocessor, graphics processor, etc.), and communications circuitry 1445 (e.g., a wireless transceiver, a radio frequency integrated circuit, a wideband RF transmitter and/or receiver, etc.). The components of integrated system 1410 may be communicatively coupled to one another for the transfer of data within integrated system 1410. Functionally, memory circuitry 1435 may provide memory and storage for integrated system 1410 including image and/or video data for display by display device 1450, processor circuitry 1440 may provide high level control for mobile computing platform 1405 as well as operations corresponding to generating image and/or video data for display by display device 1450, and communications circuitry 1445 may transmit and/or receive data including image and/or video data for display by display device 1450. For example, communications circuitry 1445 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 15:
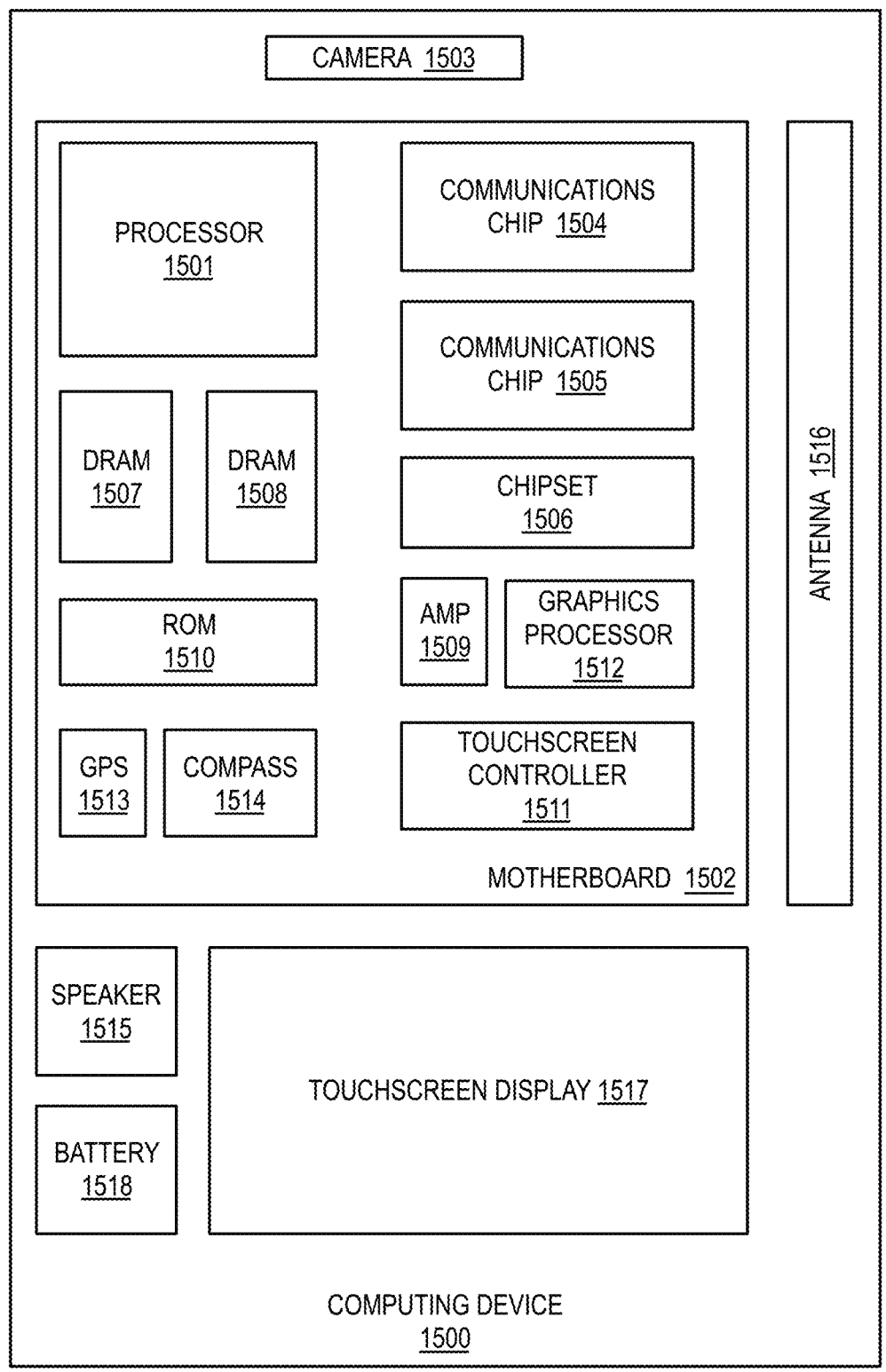
FIG. 15 is a functional block diagram of a computing device, all arranged in accordance with at least some implementations of the present disclosure.

FIG. 15 is a functional block diagram of a computing device 1500, arranged in accordance with at least some implementations of the present disclosure. Computing device 1500 or portions thereof may be implemented via or mobile computing platform 1505, for example, and further includes a motherboard 1502 hosting a number of components, such as, but not limited to, a processor 1501 (e.g., an applications processor, a microprocessor, etc.) and one or more communications chips 1504, 1505. Processor 1501 may be physically and/or electrically coupled to motherboard 1502. In some examples, processor 1501 includes an integrated circuit die packaged within the processor 1501. In general, the term "processor" may refer to any device or portion of a device that processes electronic data from registers and/or memory to transform that electronic data into other electronic data that may be stored in registers and/or memory.

In various examples, one or more communication chips 1504, 1505 may also be physically and/or electrically coupled to the motherboard 1502. In further implementations, communication chips 1504 may be part of processor 1501. Depending on its applications, computing device 1500 may include other components that may or may not be physically and electrically coupled to motherboard 1502. These other components may include, but are not limited to, volatile memory (e.g., DRAM) 1507, 1508, non-volatile memory (e.g., ROM) 1510, a graphics processor 1512, flash memory, global positioning system (GPS) device 1513, compass 1514, a chipset 1506, an antenna 1516, a power amplifier 1509, a touchscreen controller 1511, a touchscreen display 1517, a speaker 1515, a camera 1503, and a battery 1518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 1517 may implement any emissive display device structure(s) discussed herein.

Communication chips 1504, 1505 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1504, 1505 may implement any of a number of wireless standards or protocols, including but not limited to those described elsewhere herein. As discussed, computing device 1500 may include a plurality of communication chips 1504, 1505. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 1504, 1505 may provide a wireless transceiver for computing device 1500. As discussed, touchscreen display 1517 of computing device 1500 may include or utilize one or more emissive display device structures discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first examples, an emissive display device comprises an emissive display element disposed over a substrate and a metamaterial lens over at least a portion of an emissive surface of the emissive display element, wherein the metamaterial lens comprises a plurality of nanoparticles.

In one or more second examples, for any of the first examples, at least a portion of the plurality of nanoparticles have a cross-sectional shape comprising one of a circle, an oval, a square, a rectangle, a cross, or a boomerang shape.

In one or more third examples, for any of the first or second examples, each of the plurality of nanoparticles comprises at least one of silicon, titanium oxide, gallium phosphide, or diamond.

In one or more fourth examples, for any of the first through third examples, at least a portion of the plurality of nanoparticles have a cross-sectional shape comprising one of a circle, an oval, a square, a rectangle, a cross, or a boomerang shape and/or each of the plurality of nanoparticles comprises at least one of silicon, titanium oxide, gallium phosphide, or diamond.

In one or more fifth examples, for any of the first through fourth examples, the emissive display element further comprises a transparent buffer layer on the emissive surface of the emissive display element such that the metamaterial lens is on the transparent buffer layer.

In one or more sixth examples, for any of the first through fifth examples, the emissive display element further comprises a second emissive display element disposed over the substrate, the second emissive display element to emit a different band of light than the emissive display element is to emit, and a second metamaterial lens over at least a portion of a second emissive surface of the second emissive display element such that the second metamaterial lens comprises a plurality of second nanoparticles, the plurality of nanoparticles have a first cross-sectional shape and the plurality of second nanoparticles have a second cross-sectional shape, and the first cross-sectional shape and the second cross-sectional shape are different.

In one or more seventh examples, for any of the first through sixth examples, the emissive display element further comprises a second emissive display element disposed over the substrate, the second emissive display element to emit a different band of light than the emissive display element is to emit, and a second metamaterial lens over at least a portion of a second emissive surface of the second emissive display element such that the second metamaterial lens comprises a plurality of second nanoparticles and the plurality of nanoparticles are different than the plurality of second nanoparticles.

In one or more eighth examples, for any of the first through seventh examples, the plurality of nanoparticles have a first cross-sectional shape and the plurality of second nanoparticles have a second cross-sectional shape such that the first cross-sectional shape and the second cross-sectional shape are different.

In one or more ninth examples, for any of the first through eighth examples, the emissive display element further comprises a third emissive display element disposed over the substrate, the third emissive display element to emit a blue band of light such that the emissive display element is to emit a red band of light and the second emissive display element is to emit a green band of light, and a third metamaterial lens over at least a portion of a third emissive surface of the third emissive display element such that the third metamaterial lens comprises a plurality of third nanoparticles different than the plurality of nanoparticles.

In one or more tenth examples, for any of the first through ninth examples, the plurality of nanoparticles have a first average cross-sectional size, the plurality of second nanoparticles have a second average cross-sectional size, and the plurality of third nanoparticles have a third average cross-sectional size such that the first average cross-sectional size is greater than the second average cross-sectional size and the second average cross-sectional size is greater than the third average cross-sectional size.

In one or more eleventh examples, for any of the first through tenth examples, the plurality of nanoparticles have a first cross-sectional shape, the plurality of second nanoparticles have a second cross-sectional shape, and the plurality of third nanoparticles have a third cross-sectional shape such that the first, second, and third cross-sectional shapes are different.

In one or more twelfth examples, for any of the first through eleventh examples, the emissive display element comprises one of a light emitting diode, an organic light emitting diode, or a vertical-cavity surface-emitting laser and the metamaterial lens comprises a collimating metamaterial lens.

In one or more thirteenth examples, for any of the first through twelfth examples, the plurality of nanoparticles comprises a high aspect ratio nanoparticle having an aspect ratio of a height of the nanoparticle to a width of the nanoparticle of at least 2.5.

In one or more fourteenth examples, for any of the first through thirteenth examples, an augmented reality device comprises the emissive display device of any of the first through thirteenth examples, augmented reality optics optically coupled to the emissive display device, and an integrated system coupled to the emissive display device and configured to provide image data to the emissive display device.

In one or more fifteenth examples, for any of the first through fourteenth examples, the augmented reality optics comprise a visual layer having a prism.

In one or more sixteenth examples, for any of the first through fifteenth examples, the augmented reality optics comprise a waveguide and first and second holographic beam splitters disposed on opposite ends of the waveguide.

In one or more seventeenth examples, a method for fabricating an emissive display device comprises fabricating an emissive display element over a substrate, disposing an optical coating layer over at least a portion of an emissive surface of the emissive display element, and patterning the optical coating layer to form a metamaterial lens comprising a plurality of nanoparticles over at least the portion of the emissive surface of the emissive display element.

In one or more eighteenth examples, for any of the seventeenth examples, the method further comprises disposing a transparent buffer layer on the emissive surface of the emissive display element such that disposing the optical coating layer comprises disposing the optical coating layer on the transparent buffer layer.

In one or more nineteenth examples, for any of the seventeenth or eighteenth examples, disposing the optical coating layer comprises a low temperature deposition at a temperature no greater than 400° C.

In one or more twentieth examples, for any of the seventeenth through nineteenth examples, disposing the optical coating layer comprises at least one of atomic layer deposition, plasma enhanced atomic layer deposition, chemical vapor deposition, plasma enhanced chemical vapor deposition, or physical sputtering deposition and patterning the optical coating layer comprises at least one of deep ultraviolet lithography, extreme ultraviolet lithography, nanoimprint lithography, or electron beam lithography.

In one or more twenty-first examples, for any of the seventeenth through twentieth examples, the method further comprises fabricating a second emissive display element and a third emissive display element over the substrate such that the third emissive display element is to emit a blue band of light, the second emissive display element is to emit a green band of light, and the emissive display element is to emit a red band of light, such that disposing the optical coating layer comprises disposing the optical coating layer over at least a portion of a second emissive surface of the second emissive display element and a portion of a third emissive surface of the third emissive display element, patterning the optical coating layer comprises patterning the optical coating layer to form a second metamaterial lens comprising a plurality of second nanoparticles over at least the portion of the second emissive surface of the second emissive display element and a third metamaterial lens comprising a plurality of third nanoparticles over at least the portion of the third emissive surface of the third emissive display element, and the plurality of nanoparticles have a first average cross-sectional size, the plurality of second nanoparticles have a second average cross-sectional size, and the plurality of third nanoparticles have a third average cross-sectional size such that the first average cross-sectional size is greater than the second average cross-sectional size, which is greater than the third average cross-sectional size.

It will be recognized that the embodiments is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An augmented reality device comprising:
    an emissive display device comprising:
        an emissive display element; and
        a metamaterial lens over at least a portion of an emissive surface of the emissive display element, wherein the metamaterial lens comprises a plurality of nanoparticles;
    augmented reality optics optically coupled to the emissive display device; and
    an integrated system coupled to the emissive display device and configured to provide image data to the emissive display device.

2. The augmented reality device of claim 1, wherein the augmented reality optics comprise a visual layer comprising a prism.

3. The augmented reality device of claim 1, wherein the augmented reality optics comprise a waveguide and first and second holographic beam splitters on opposite ends of the waveguide.

4. The augmented reality device of claim 1, wherein the plurality of nanoparticles each comprises an aspect ratio of height to width of not less than 2.5.

5. The augmented reality device of claim 1, wherein the plurality of nanoparticles comprise at least one of silicon, titanium oxide, gallium phosphide, or diamond.

6. The augmented reality device of claim 1, further comprising:
    a second emissive display element to emit a different band of light than the emissive display element;
    a second metamaterial lens over at least a portion of a second emissive surface of the second emissive display element, wherein the second metamaterial lens comprises a plurality of second nanoparticles.

7. The augmented reality device of claim 6, wherein the emissive display element is to emit a red band of light, the second emissive display element is to emit a blue or green band of light, and the plurality of nanoparticles have a first average cross-sectional size that is greater than a second average cross-sectional size of the plurality of second nanoparticles.

8. The augmented reality device of claim 1, wherein the emissive display element comprises one of a light emitting diode, an organic light emitting diode, or a vertical-cavity surface-emitting laser.

9. An augmented reality device comprising:
    an emissive display device comprising:
        an emissive display element; and
        a plurality of nanoparticles over at least a portion of an emissive surface of the emissive display element; and
    augmented reality optics optically coupled to the emissive display device.

10. The augmented reality device of claim 9, wherein the augmented reality optics comprise a visual layer comprising a prism.

11. The augmented reality device of claim 9, wherein the augmented reality optics comprise a waveguide and first and second holographic beam splitters on opposite ends of the waveguide.

12. The augmented reality device of claim 9, wherein the plurality of nanoparticles each comprises an aspect ratio of height to width of not less than 2.5.

13. The augmented reality device of claim 12, wherein the plurality of nanoparticles have a cross-sectional shape comprising one of a circle, an oval, a square, a rectangle, a cross, or a boomerang shape.

14. The augmented reality device of claim 9, wherein the plurality of nanoparticles comprise at least one of silicon, titanium oxide, gallium phosphide, or diamond.

15. The augmented reality device of claim 9, further comprising:
    a second emissive display element to emit a different band of light than the emissive display element;
    a plurality of second nanoparticles over at least a portion of a second emissive surface of the second emissive display element.

16. The augmented reality device of claim 15, wherein the plurality of nanoparticles have one of a different cross-sectional shape or size than the plurality of second nanoparticles.

17. The augmented reality device of claim 16, wherein the emissive display element is to emit a red band of light, the second emissive display element is to emit a blue or green band of light, and the plurality of nanoparticles have a first average cross-sectional size that is greater than a second average cross-sectional size of the plurality of second nanoparticles.

18. The augmented reality device of claim 15, further comprising:
    a third emissive display element to emit a different band of light than the emissive display element and the second emissive display element;
    a plurality of third nanoparticles over at least a portion of a third emissive surface of the third emissive display element.

19. The augmented reality device of claim 9, further comprising:
    a transparent buffer layer on the emissive surface of the emissive display element, wherein the plurality of nanoparticles are on the transparent buffer layer.

20. The augmented reality device of claim 9, wherein the emissive display element comprises one of a light emitting diode, an organic light emitting diode, or a vertical-cavity surface-emitting laser.

\* \* \* \* \*